(12) United States Patent
Lin et al.

(10) Patent No.: US 12,520,565 B2
(45) Date of Patent: Jan. 6, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Bo-Rong Lin, Hsinchu (TW); Kuo-Cheng Chiang, Zhubei (TW); Shi-Ning Ju, Hsinchu (TW); Guan-Lin Chen, Baoshan Township (TW); Chih-Hao Wang, Baoshan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 704 days.

(21) Appl. No.: 17/889,831

(22) Filed: Aug. 17, 2022

(65) Prior Publication Data
US 2024/0063065 A1   Feb. 22, 2024

(51) Int. Cl.
*H10D 84/03* (2025.01)
*H01L 21/02* (2006.01)
(Continued)

(52) U.S. Cl.
CPC ..... *H10D 84/038* (2025.01); *H01L 21/02603* (2013.01); *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01); *H10D 62/151* (2025.01); *H10D 64/017* (2025.01);
(Continued)

(58) Field of Classification Search
CPC .......... H10D 84/0188; H10D 84/0151; H10D 62/114; H10D 30/014; H10D 30/43; H10D 30/6735; H10D 84/017; H10D 30/797; H10D 62/115; H10D 62/118; H01L 21/02603; H01L 21/76224; H01L 21/76831; H01L 23/5329; H01L 21/762; H01L 21/76283
See application file for complete search history.

(56) References Cited

U.S. PATENT DOCUMENTS 9,209,247 B2   12/2015   Colinge et al.
9,236,267 B2   1/2016    De et al.
(Continued)

*Primary Examiner* — Ajay Ojha
*Assistant Examiner* — Sandra Milena Rodriguez Villanu
(74) *Attorney, Agent, or Firm* — Birch, Stewart, Kolasch & Birch, LLP

(57) ABSTRACT

A method for forming a semiconductor structure is provided. The method includes forming first, second and third fin structures over a substrate, forming a first dielectric material along a first trench between the first fin structure and the second fin structure and along a second trench between the second fin structure and the third fin structure, removing a first portion of the first dielectric material along the second trench while leaving a second portion of the first dielectric material along the first trench as a dielectric liner, depositing a second dielectric material over the dielectric liner and filling the first trench and the second trench, and etching back the second dielectric material until the dielectric liner is exposed. A first portion of the second dielectric material remaining in the first trench forms a dielectric wall.

20 Claims, 30 Drawing Sheets

(51) Int. Cl.
*H10D 30/01* (2025.01)
*H10D 30/43* (2025.01)
*H10D 30/67* (2025.01)
*H10D 62/10* (2025.01)
*H10D 62/13* (2025.01)
*H10D 64/01* (2025.01)
*H10D 84/01* (2025.01)
*H10D 84/85* (2025.01)

(52) U.S. Cl.
CPC ....... *H10D 84/0167* (2025.01); *H10D 84/017* (2025.01); *H10D 84/0188* (2025.01); *H10D 84/0191* (2025.01); *H10D 84/859* (2025.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2019/0067417 A1* | 2/2019 | Ching .................. H10D 84/834 |

* cited by examiner

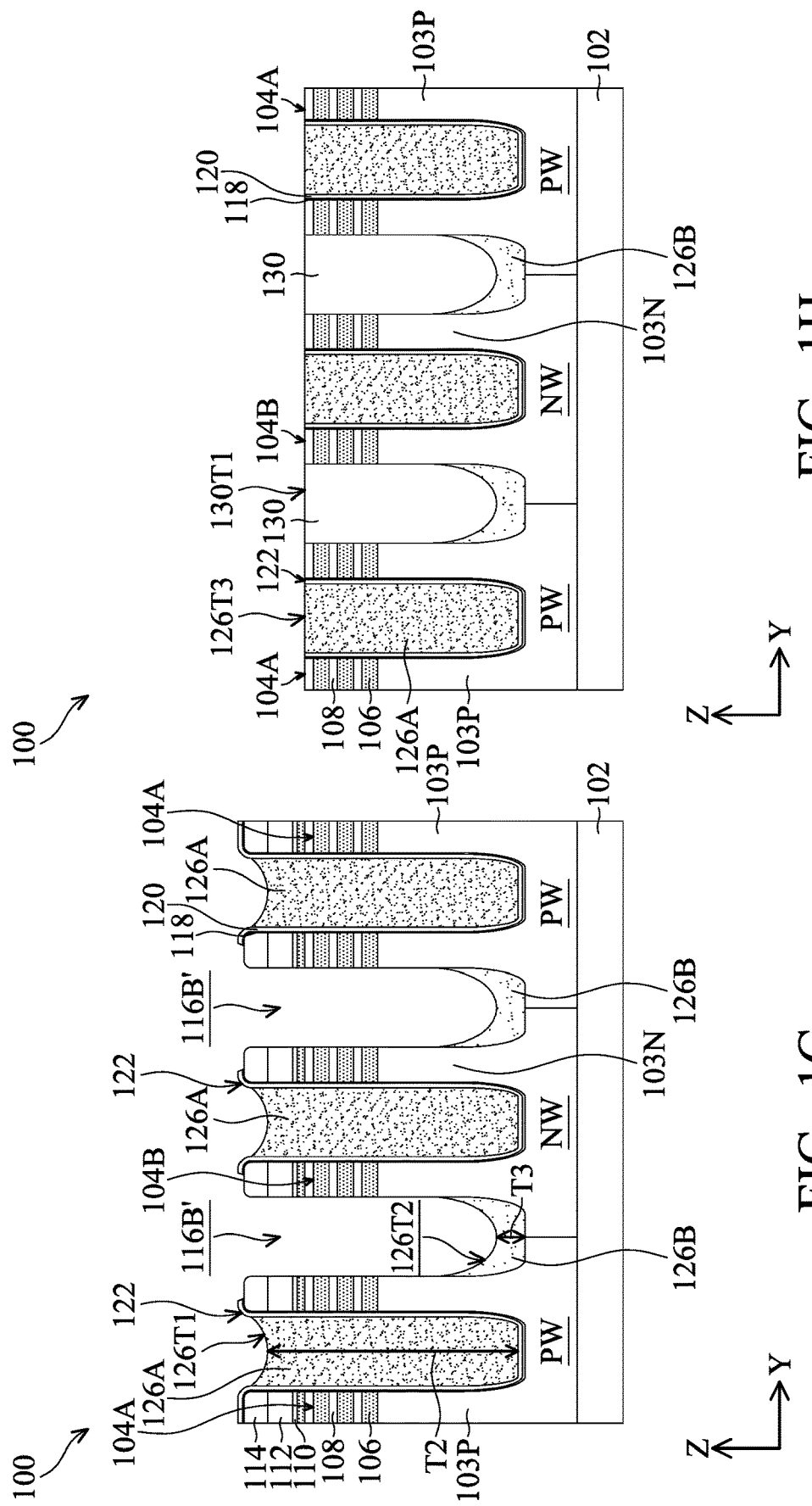

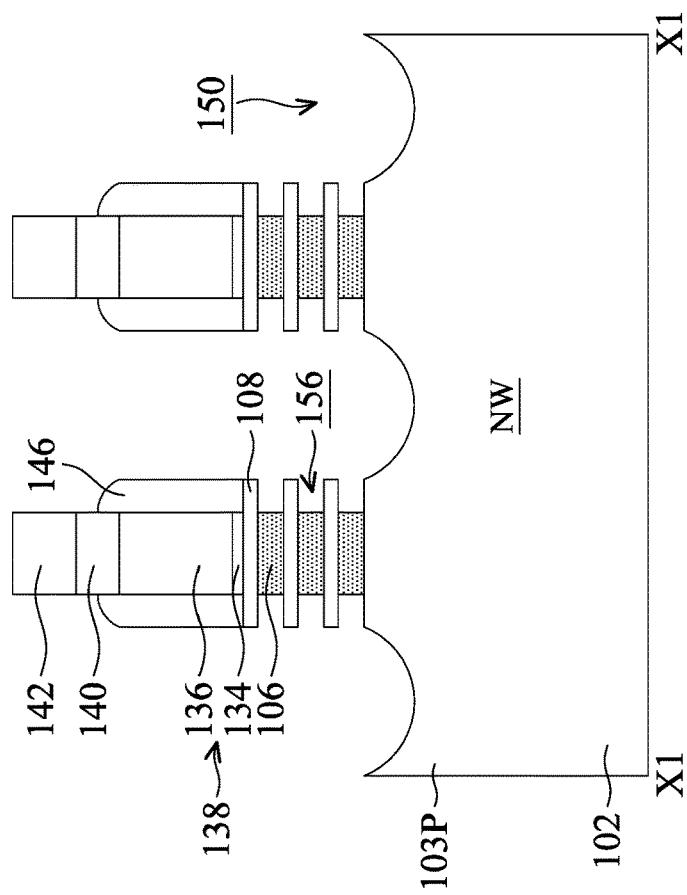
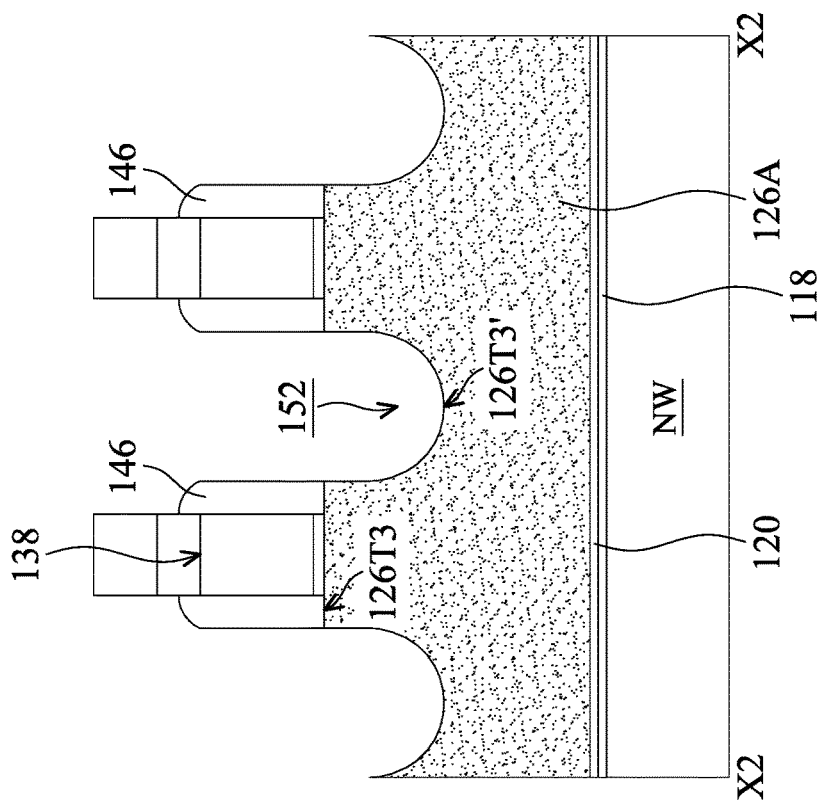
FIG. 1L-2
FIG. 1L-1

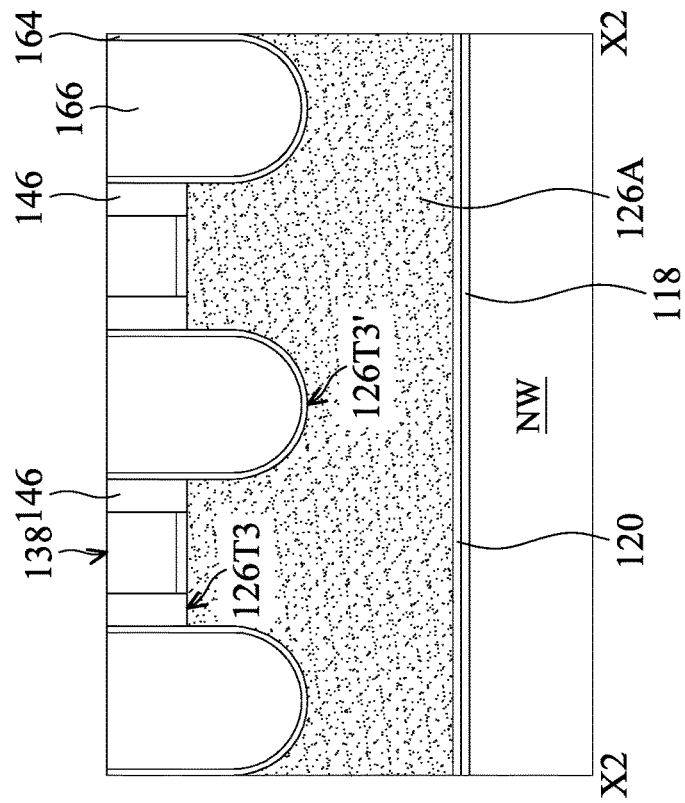
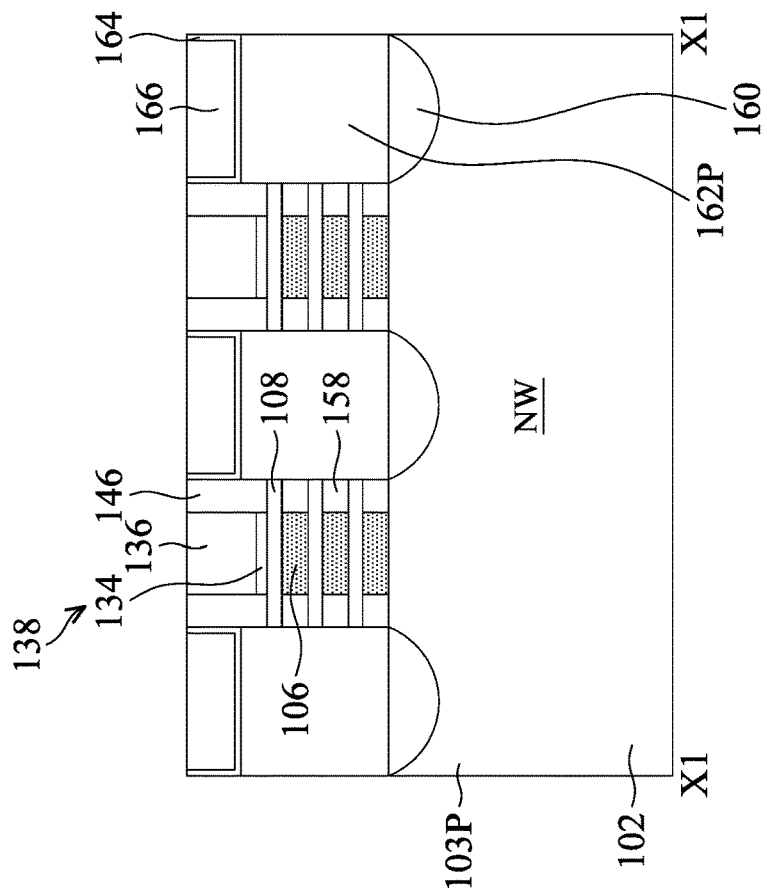
FIG. 10-1
FIG. 10-2

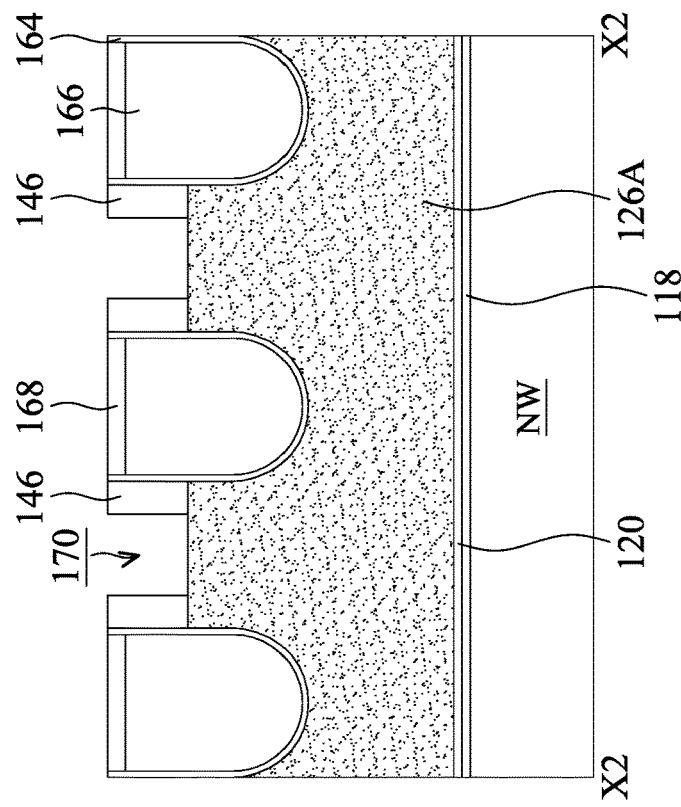
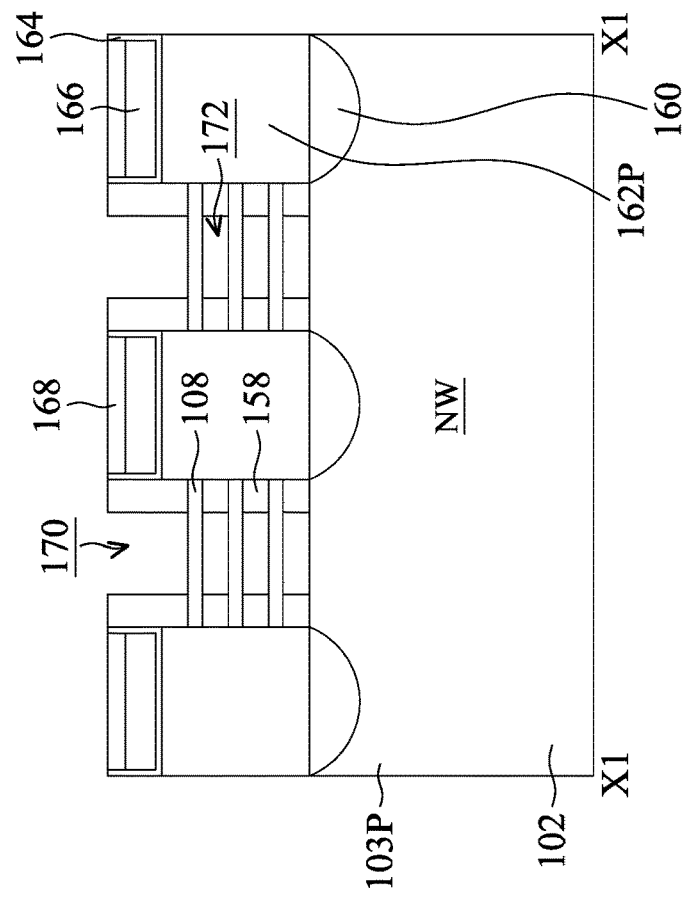
FIG. 1Q-1
FIG. 1Q-2

SEMICONDUCTOR STRUCTURE AND METHOD FOR FORMING THE SAME

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1B-1, 1C, 1D, 1E, 1F, 1G, 1H, 1I, 1J-2, 1J-3, 1J-4, 1L-1, 1L-2, 1L-3, 1O-1, 1O-2, 1O-3, 1Q, 1Q-1, 1Q-2, 1Q-3, 1R, 1S, 1S-1, 1S-2 and 1S-3 are cross-sectional views illustrating the formation of a semiconductor structure at various intermediate stages, in accordance with some embodiments of the disclosure.

FIG. 1F-1 is an enlarge view of FIG. 1F to illustrate the deposition pores for forming the dielectric material, in accordance with some embodiments.

FIG. 1J-1 is a plane view of the semiconductor structure of FIG. 1J, in accordance with some embodiments of the disclosure.

FIG. 2 is a modification of the semiconductor structure of FIG. 1S, in accordance with some embodiments of the disclosure.

DETAILED DESCRIPTION

Figure 1A:
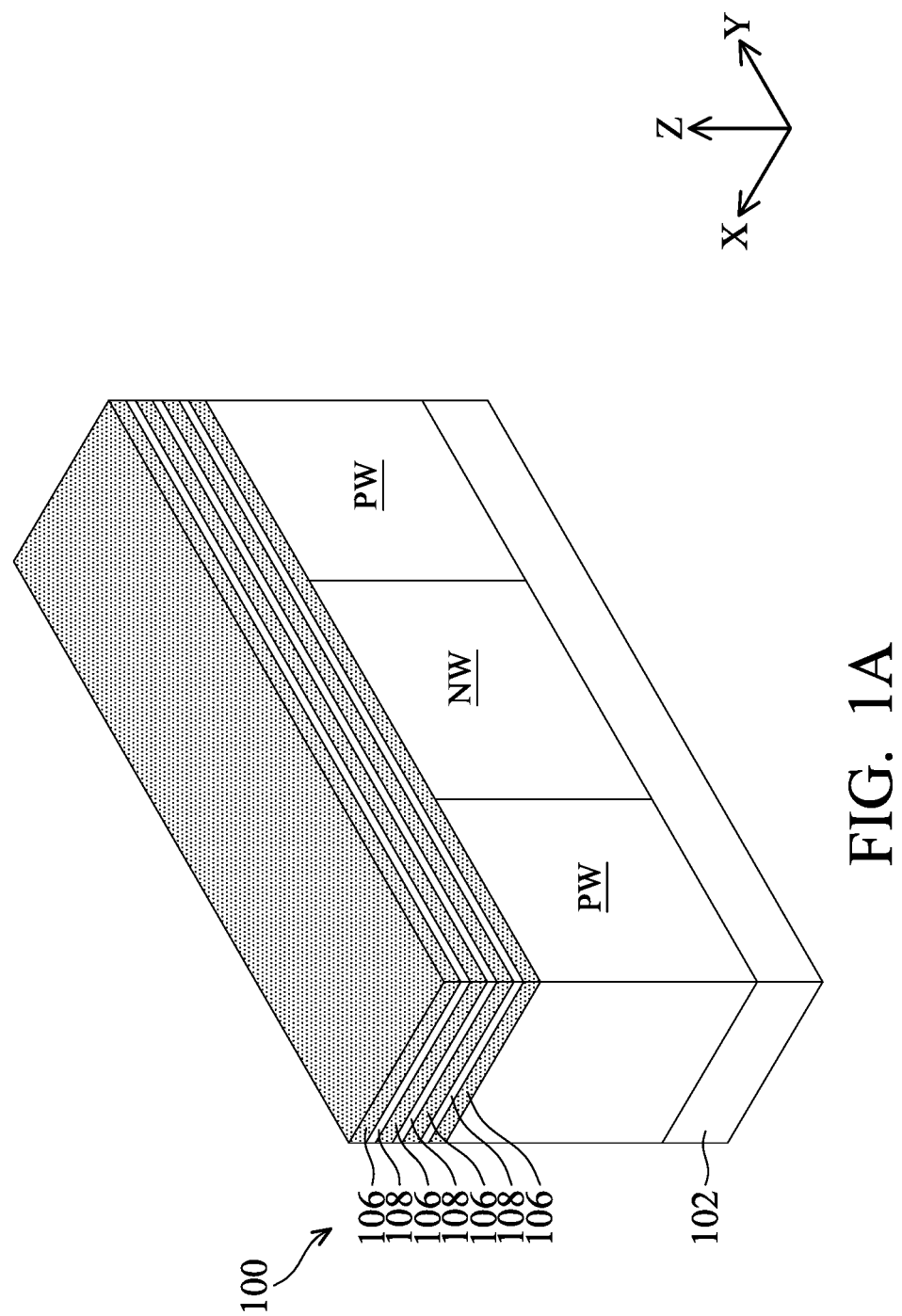
FIGS. 1A, 1B, 1J, 1K, 1L, 1M, 1N, 1O and 1P are perspective views illustrating the formation of a semiconductor structure at various intermediate stages, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography with self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor structure are provided. The aspect of the present disclosure is directed to a semiconductor structure having a fork-sheet structure. In some embodiments, a fork-sheet structure includes two sets of nanostructures and a dielectric wall therebetween. The fork-sheet structure may provide benefits, e.g., one or more of (1) uniform threshold voltage, (2) low parasitic capacity, and (3) good gate control.

As the scale of the semiconductor devices continues to shrink, forming the dielectric walls at specific locations is increasingly challenging because the trenches (between the fin structures) also have smaller and smaller dimensional differences. In accordance with the embodiments of the present disclosure, the method for forming the semiconductor structure includes forming a dielectric liner in a first trench using a patterning process such that the dimension of the remaining portion of a first trench is less than the dimension of a second trench. The method further includes forming a dielectric material in the first and second trenches, and etching back the dielectric material. Because the first trench is overfilled by the dielectric material while the second trench is partially filled by the dielectric wall, and thus the dielectric wall may be selectively formed in the first trench. Therefore, the difficulty of forming a dielectric wall may be reduced, and the yield of manufacturing the semiconductor device may be improved.

Figure 1B:
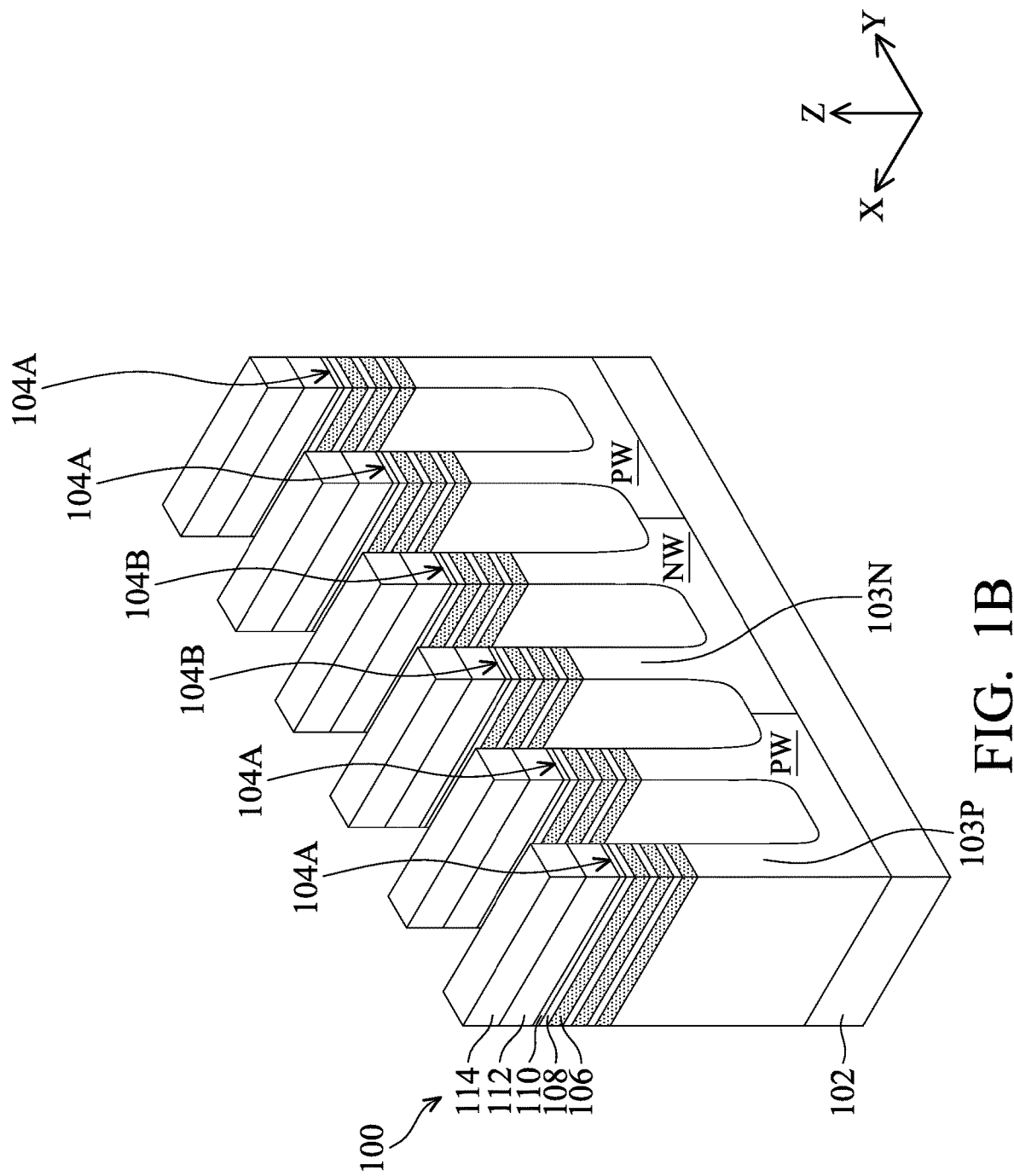
Figures 1, 1B:
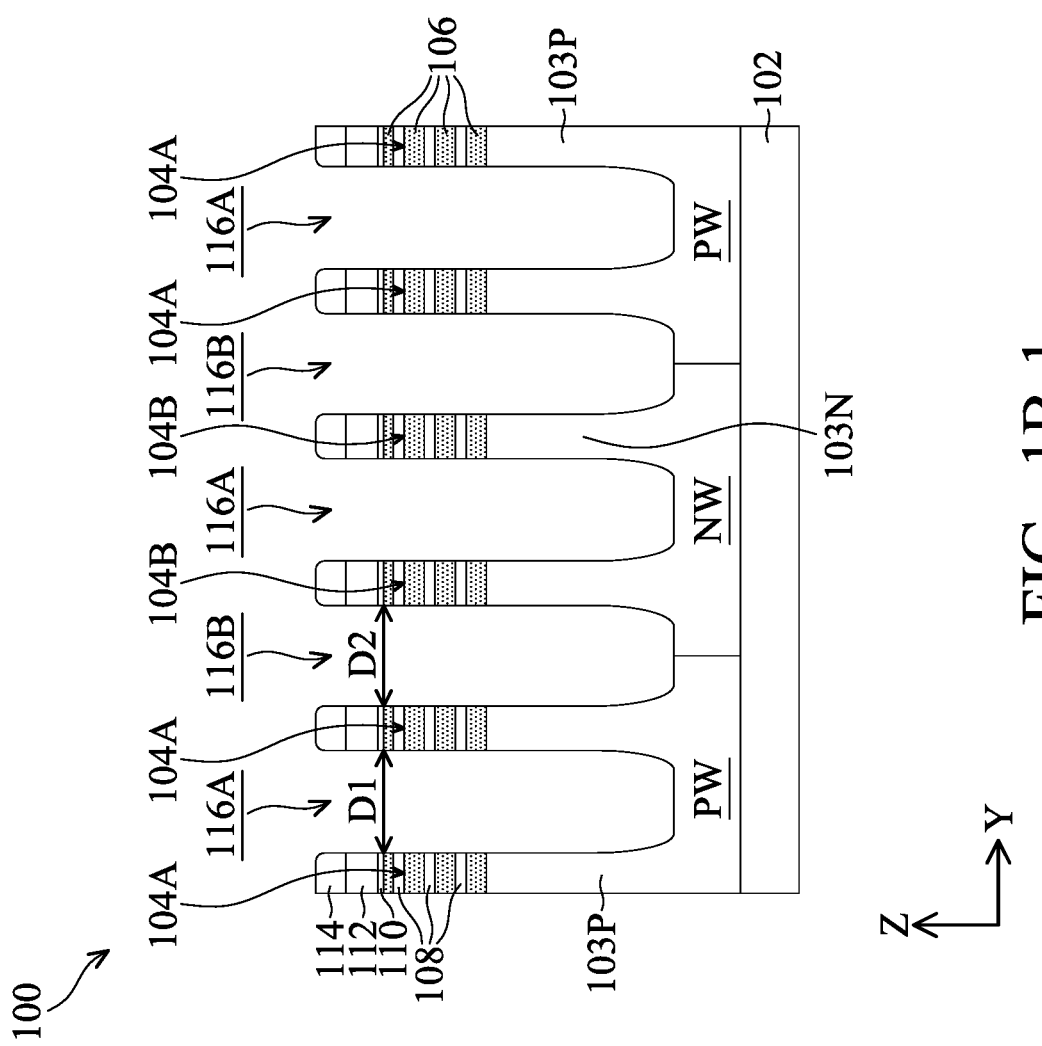
Figures 1C, 1D:
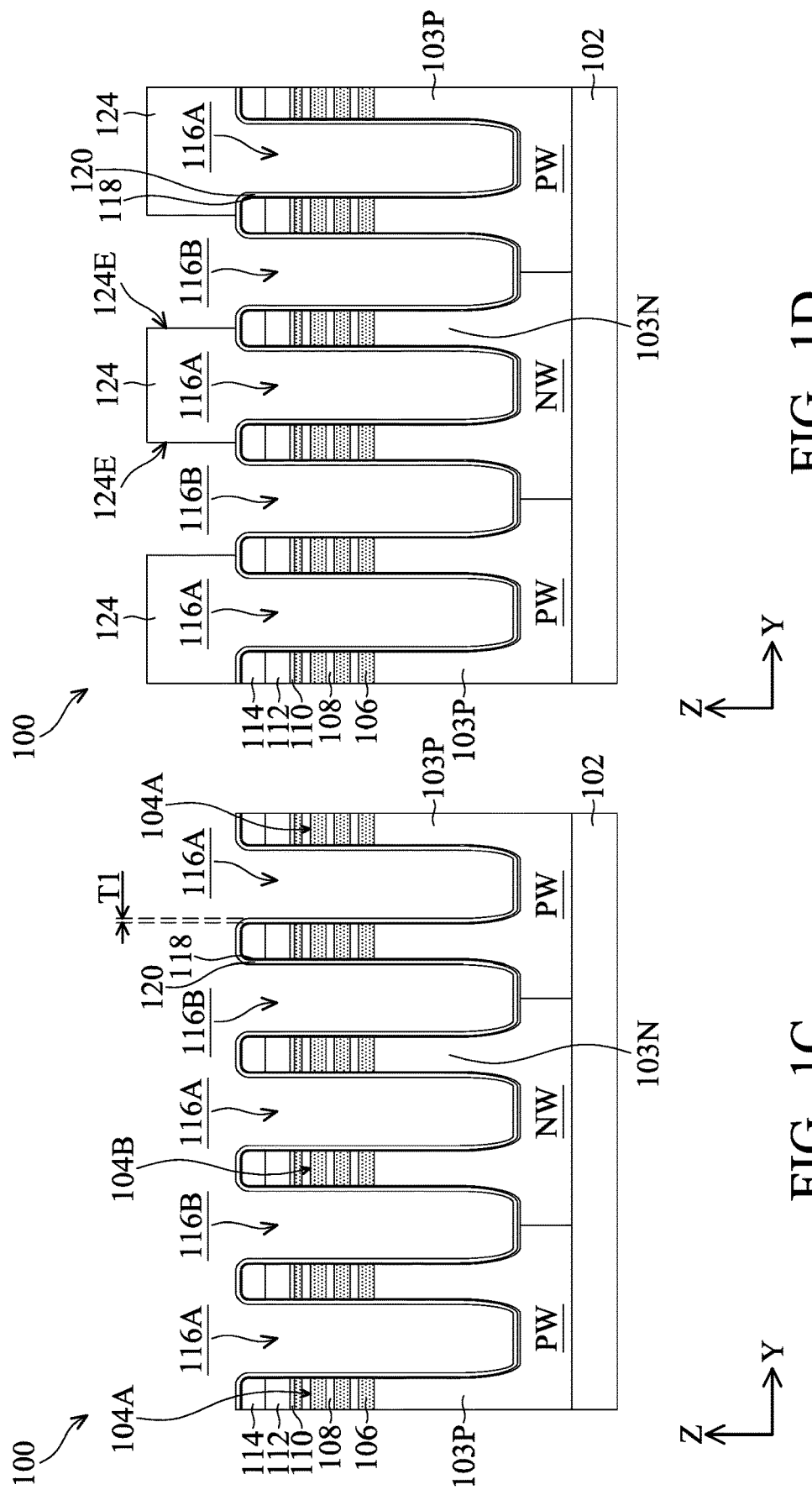
Figures 1E, 1F:
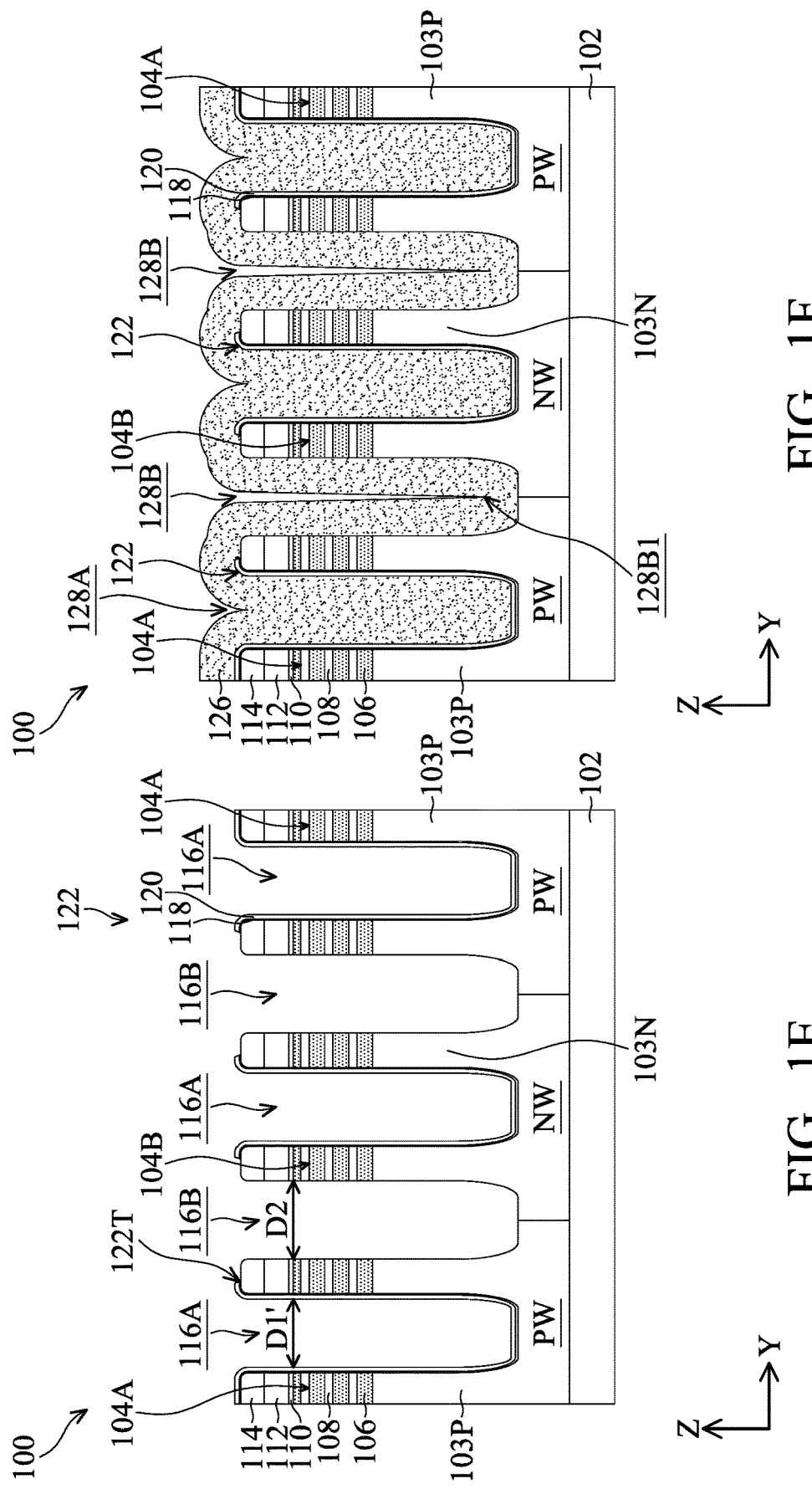
Figures 1, 1F:
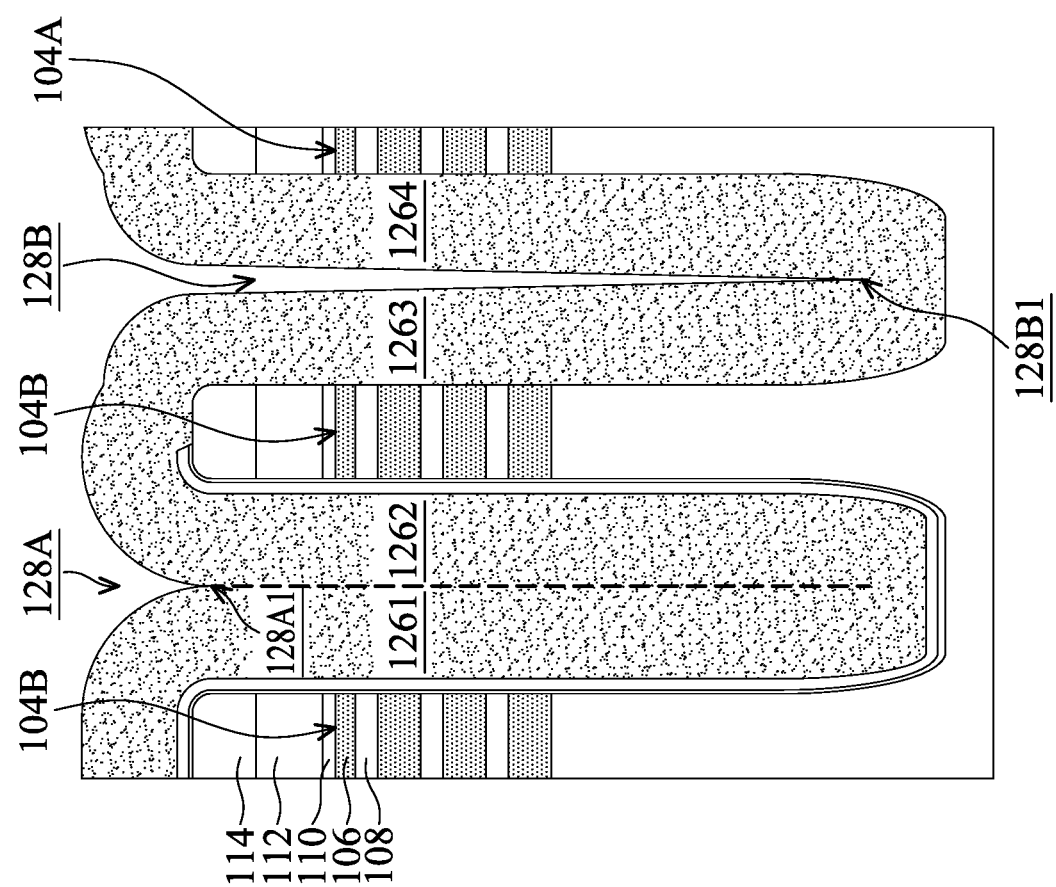
Figure 1I:
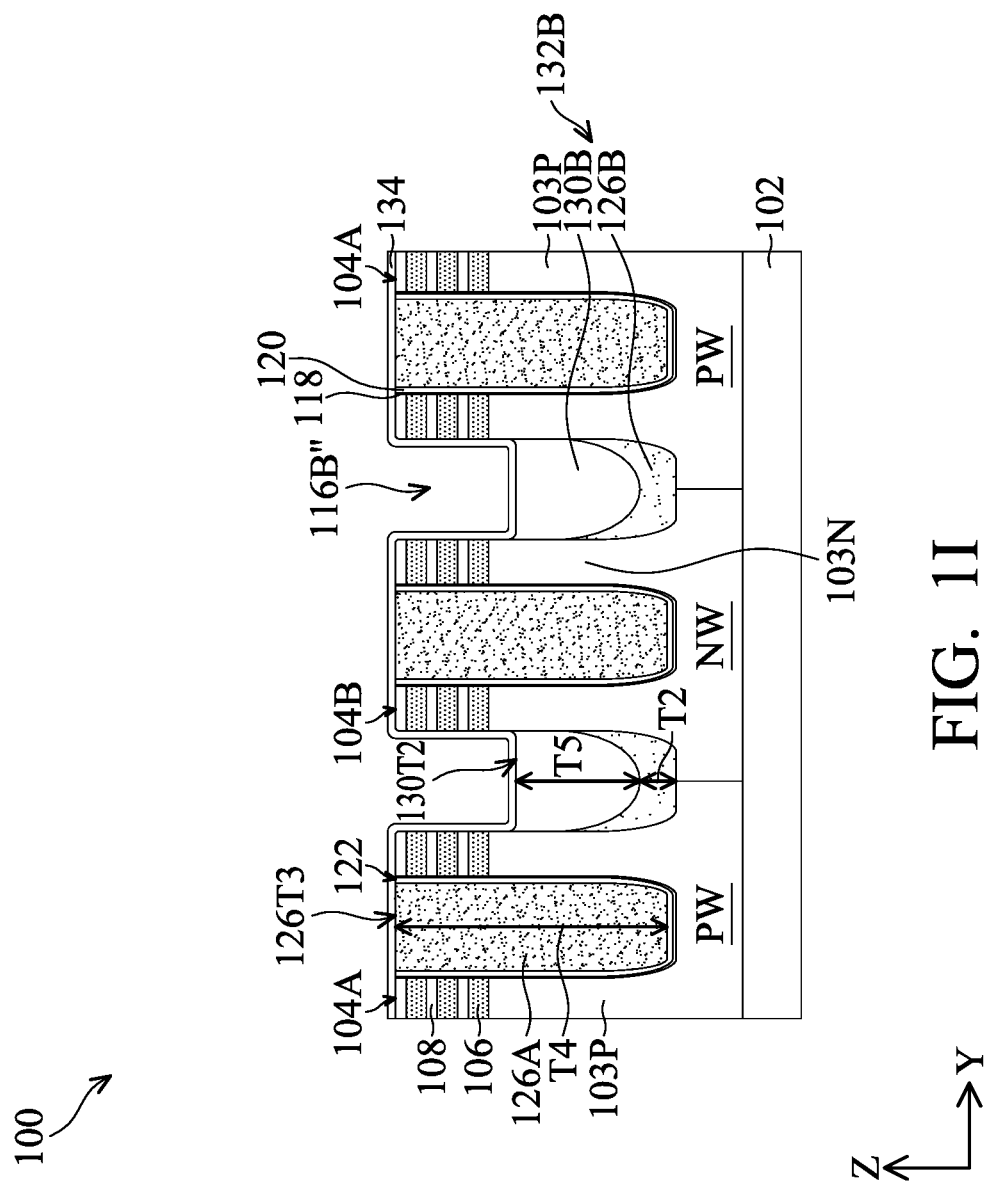
Figure 1J:
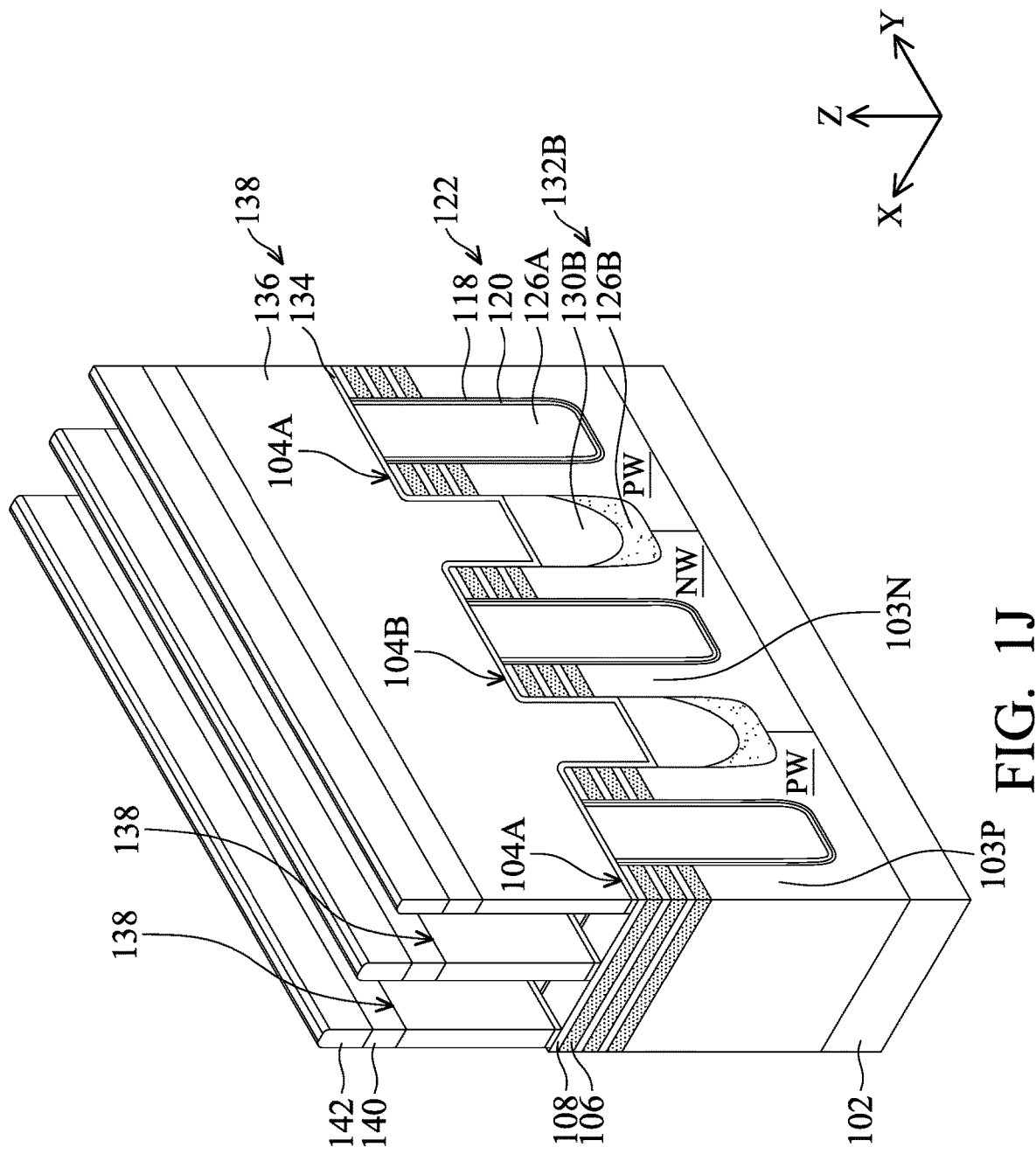
Figures 1, 1J:
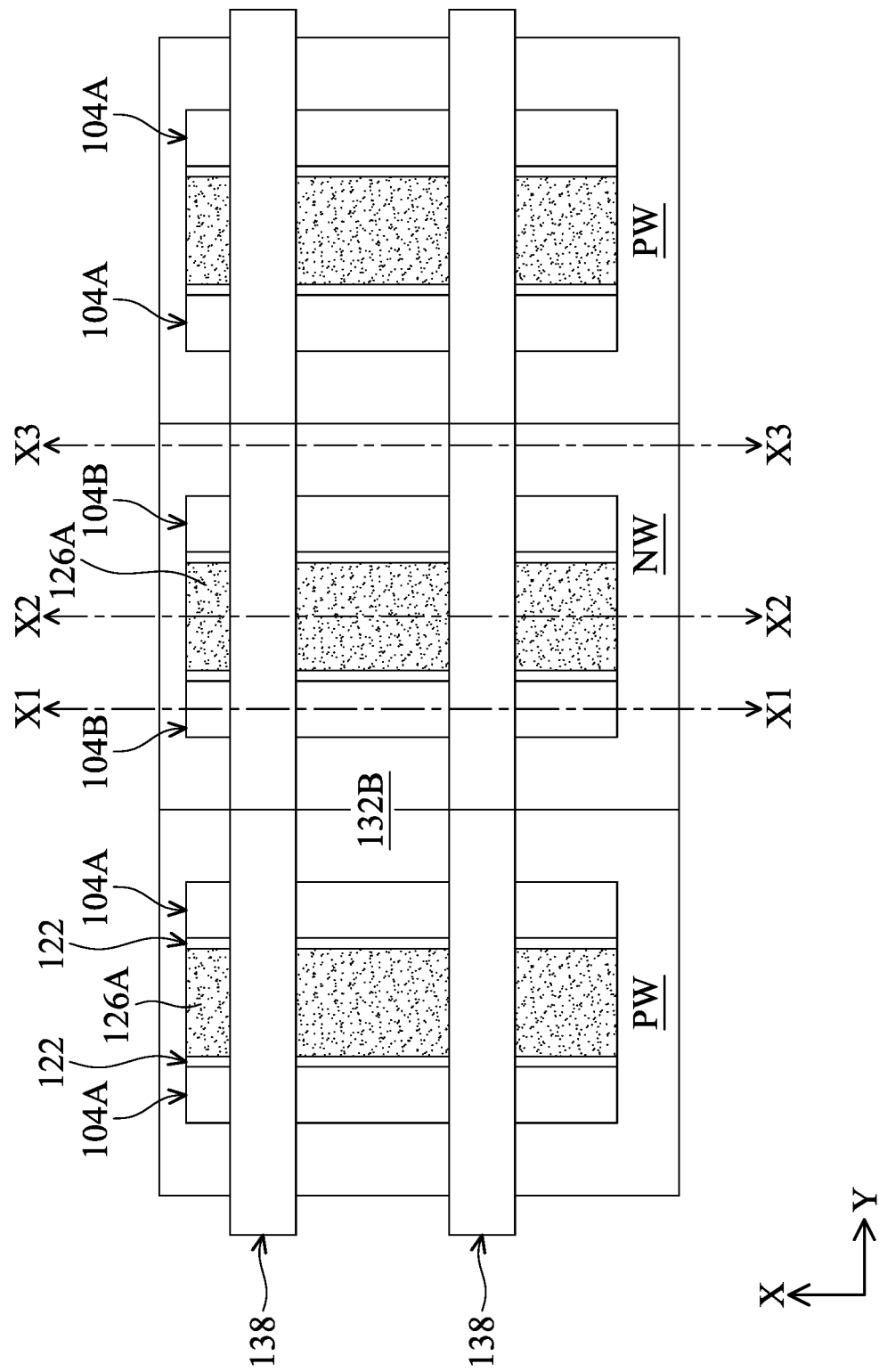
Figures 1, 1J, 2, 3:
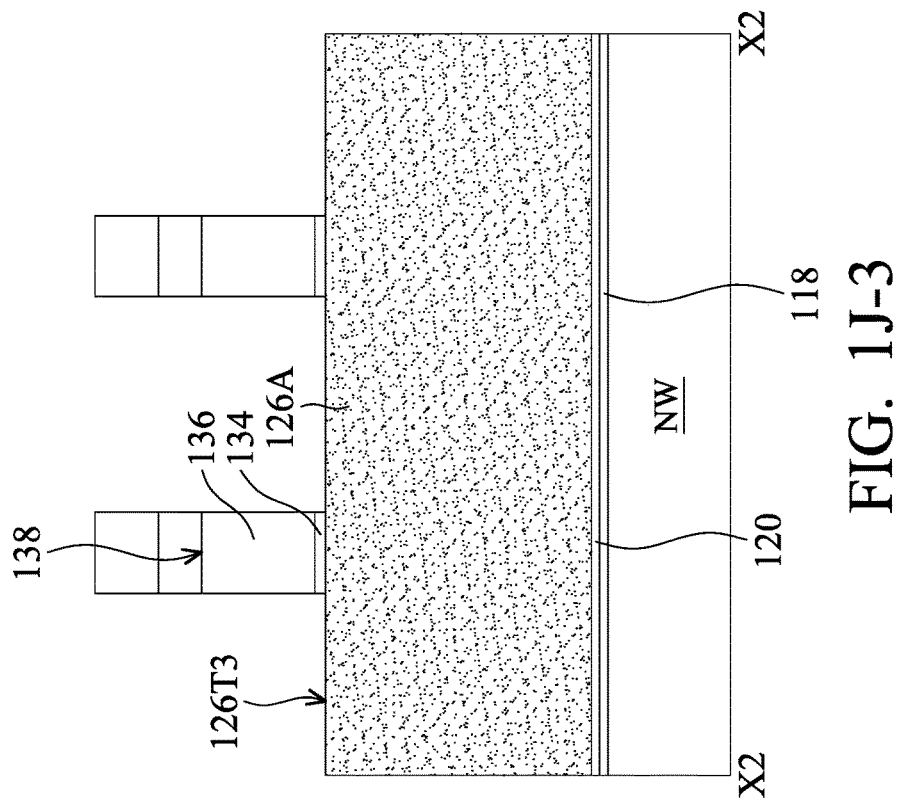
Figures 1, 1J, 2:
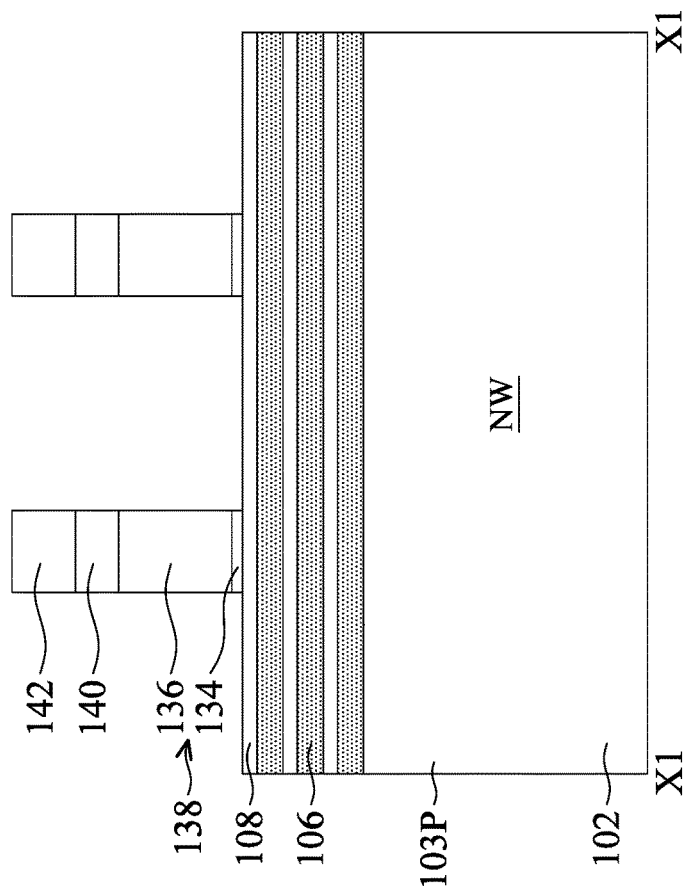
Figures 1, 1J, 2, 3, 4:
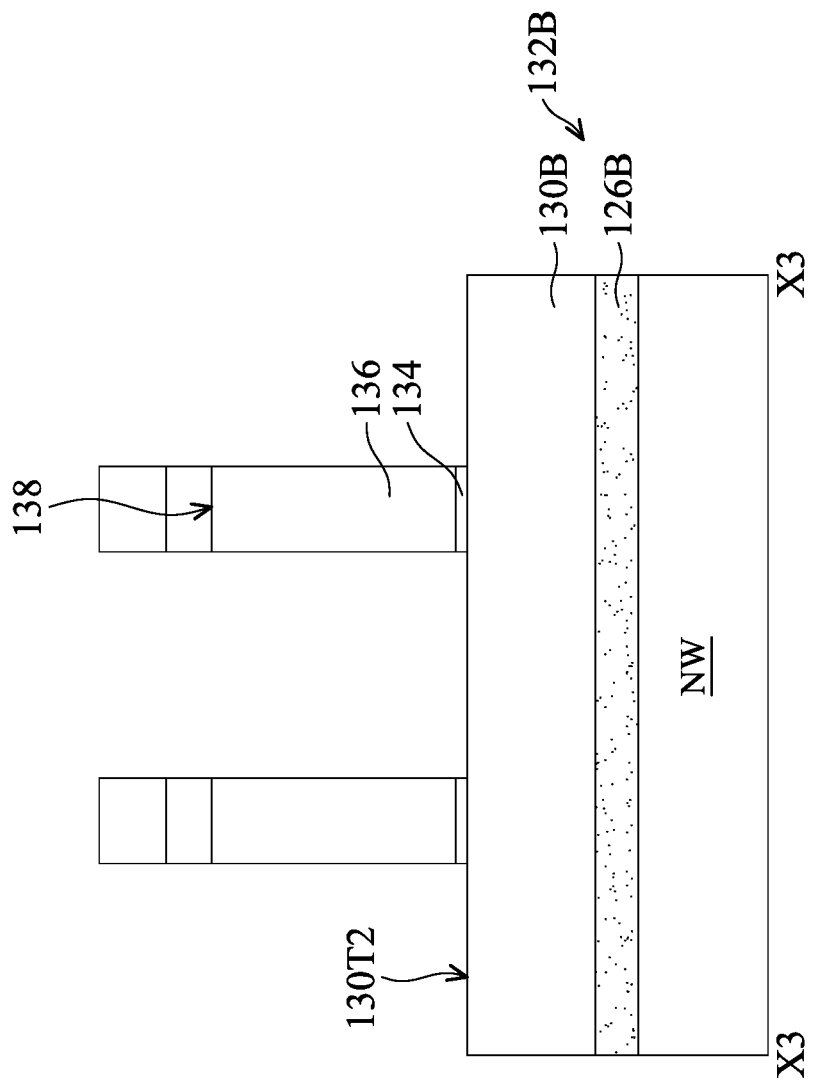
Figure 1K:
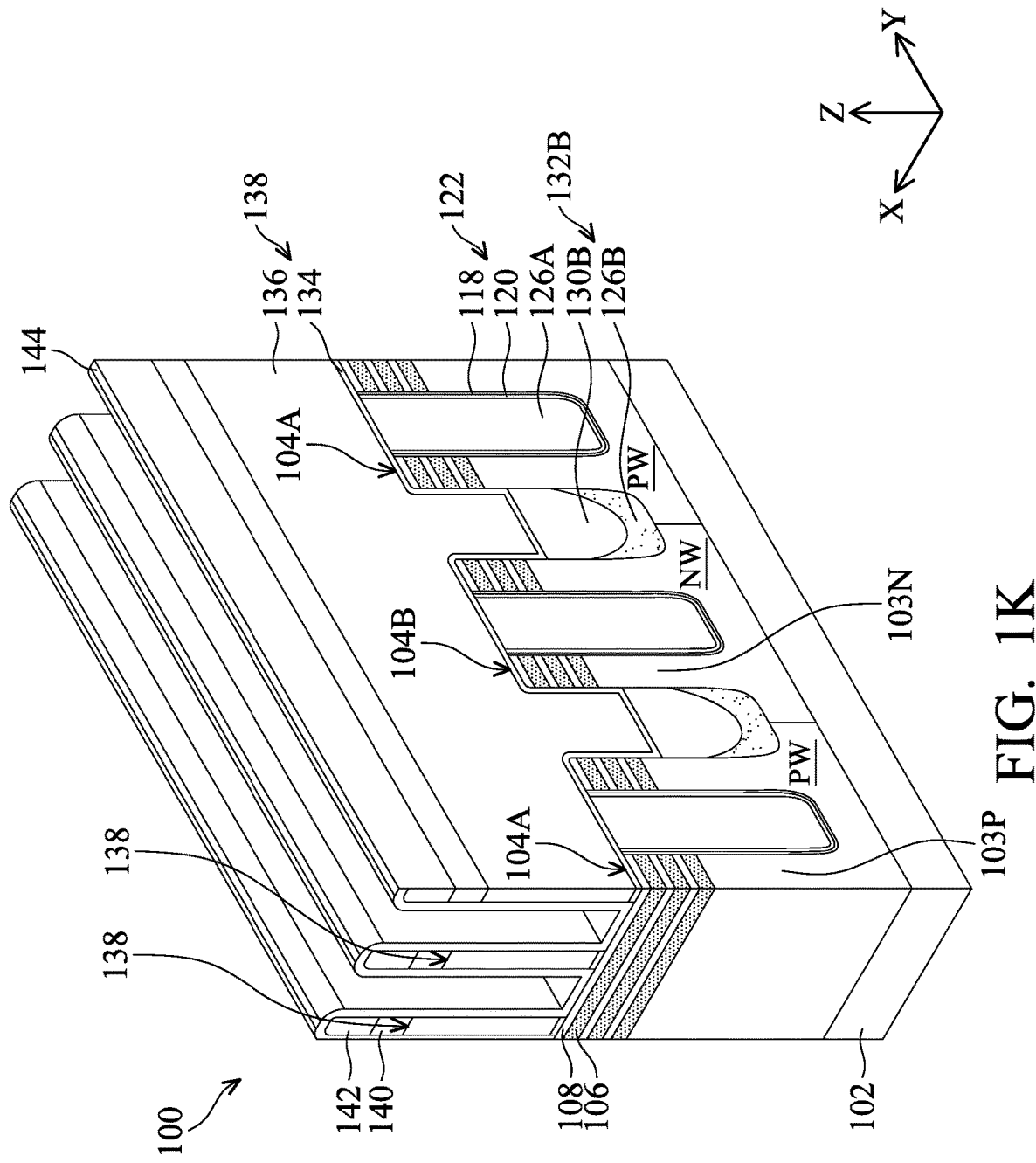
Figure 1L:
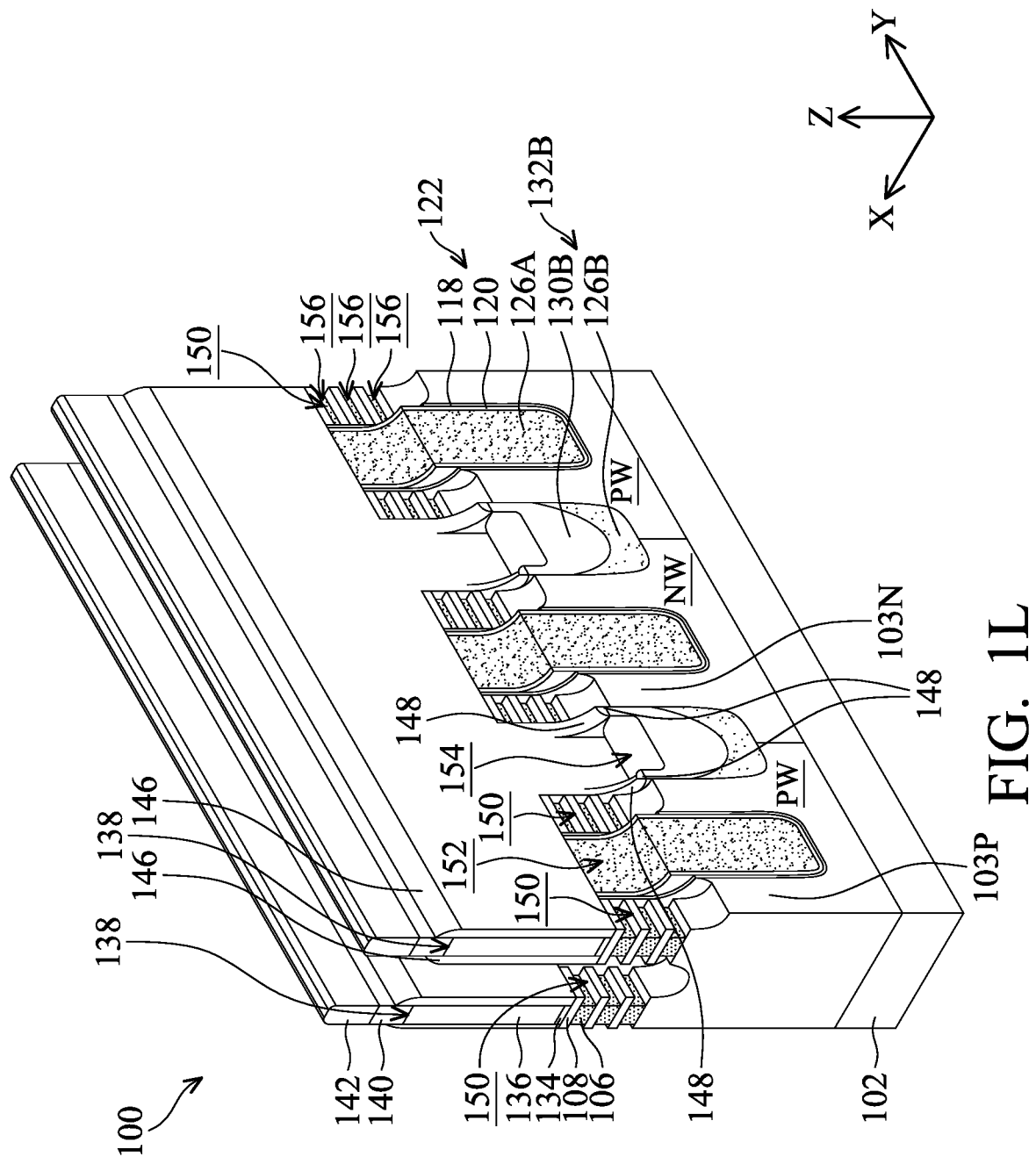
Figures 1, 1L, 2, 3:
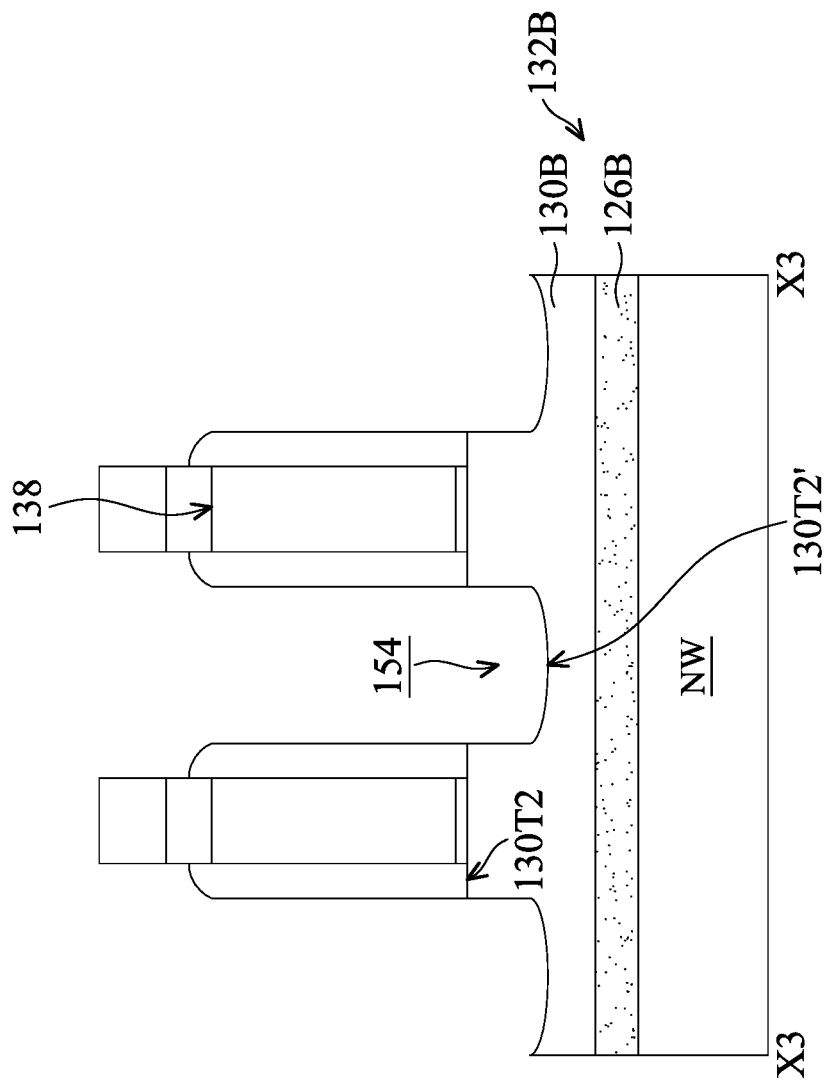
Figure 1M:
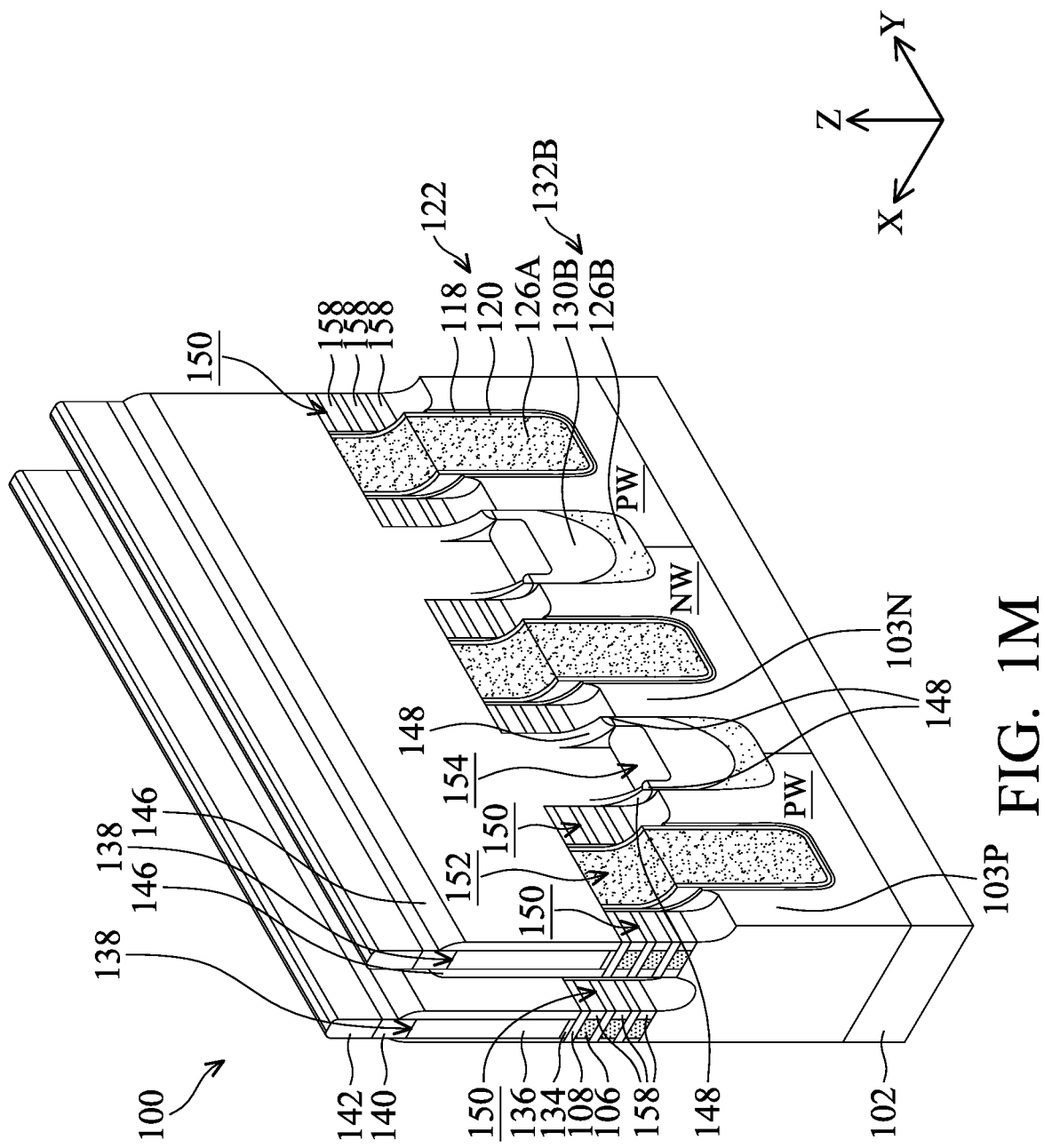
Figure 1N:
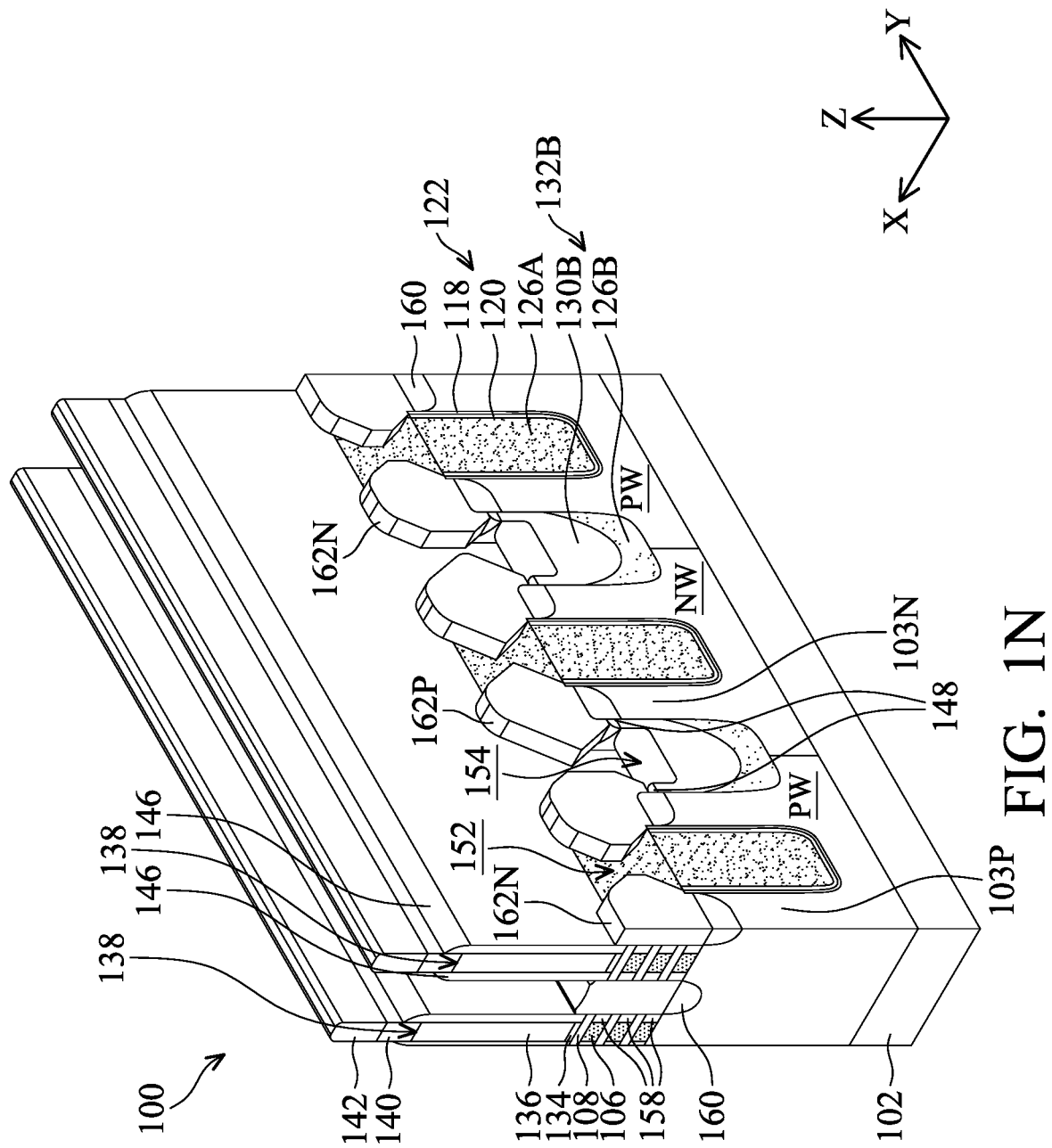
Figure 1O:
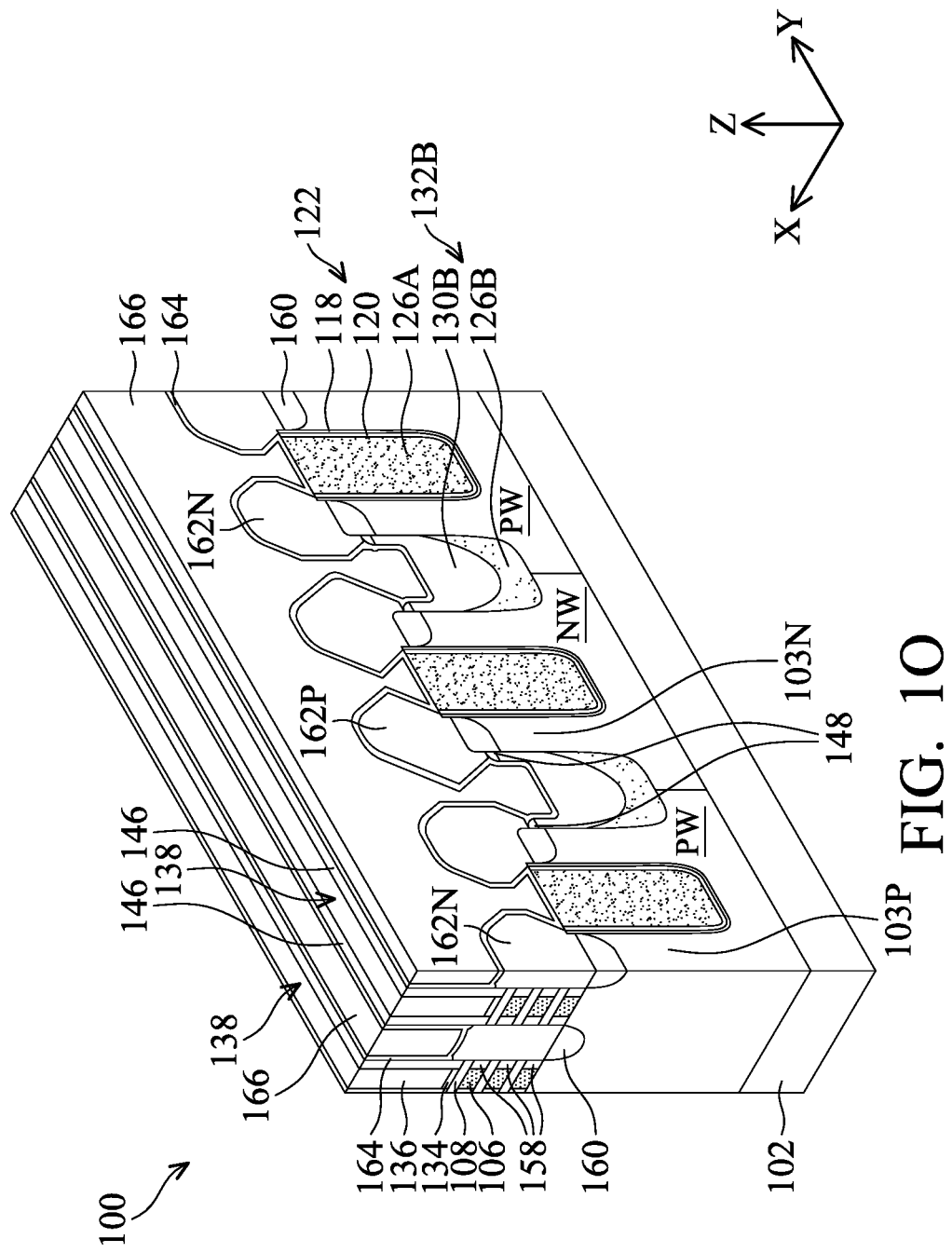
Figures 3, 10:
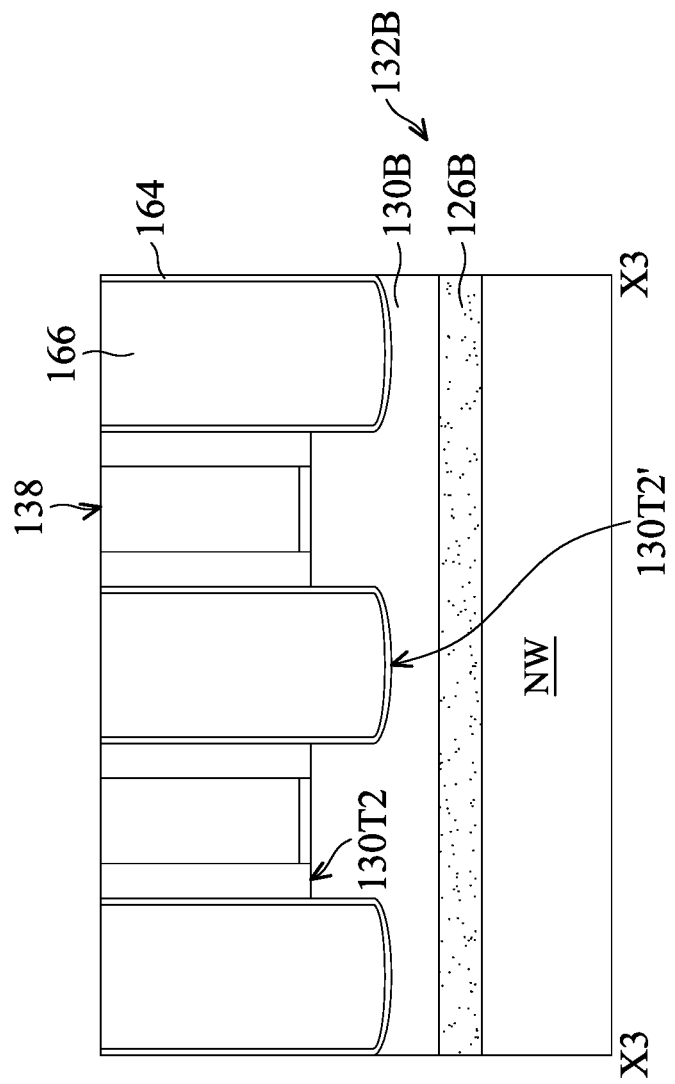
Figure 1P:
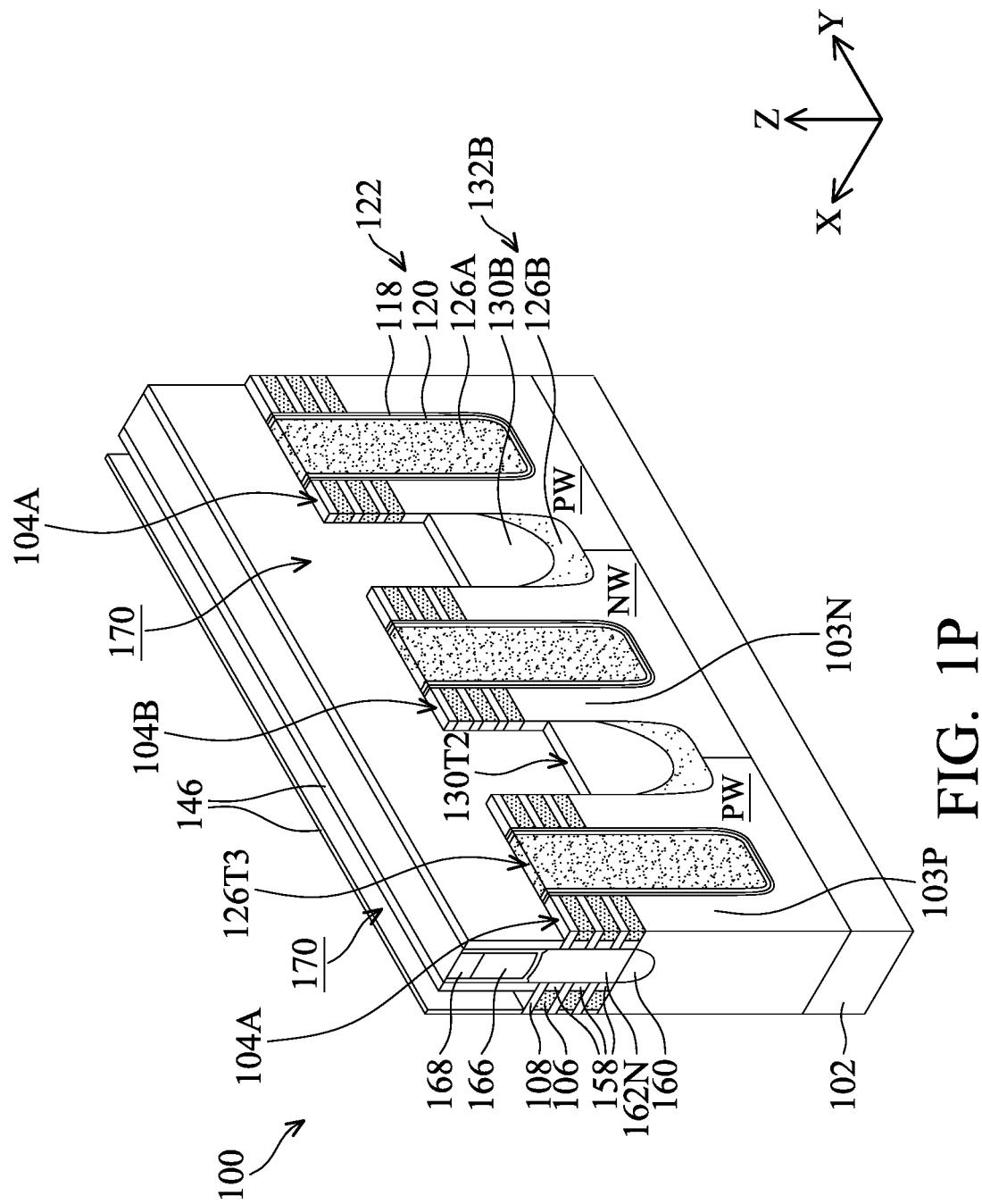
Figure 1Q:
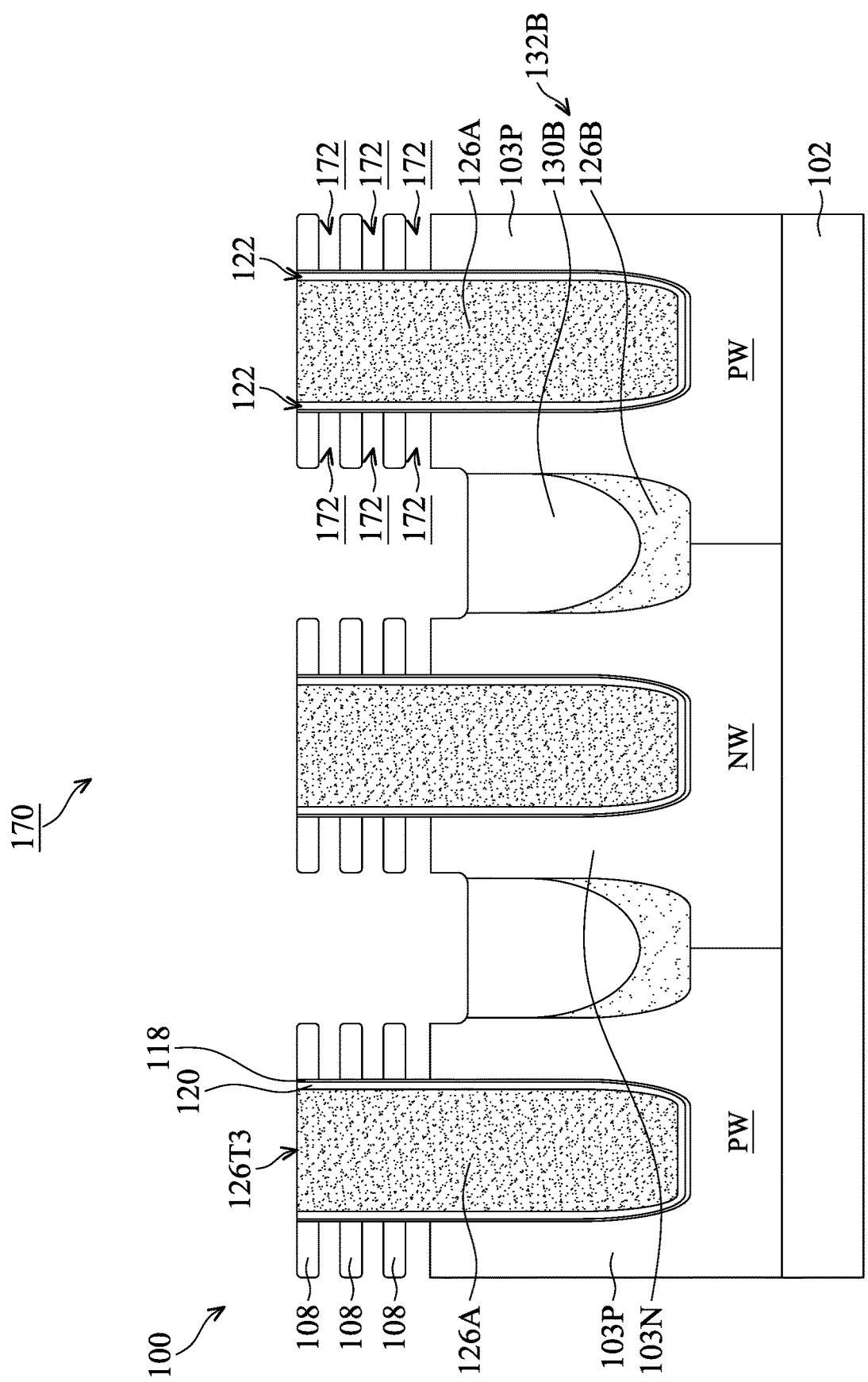
Figures 1, 1Q, 2, 3:
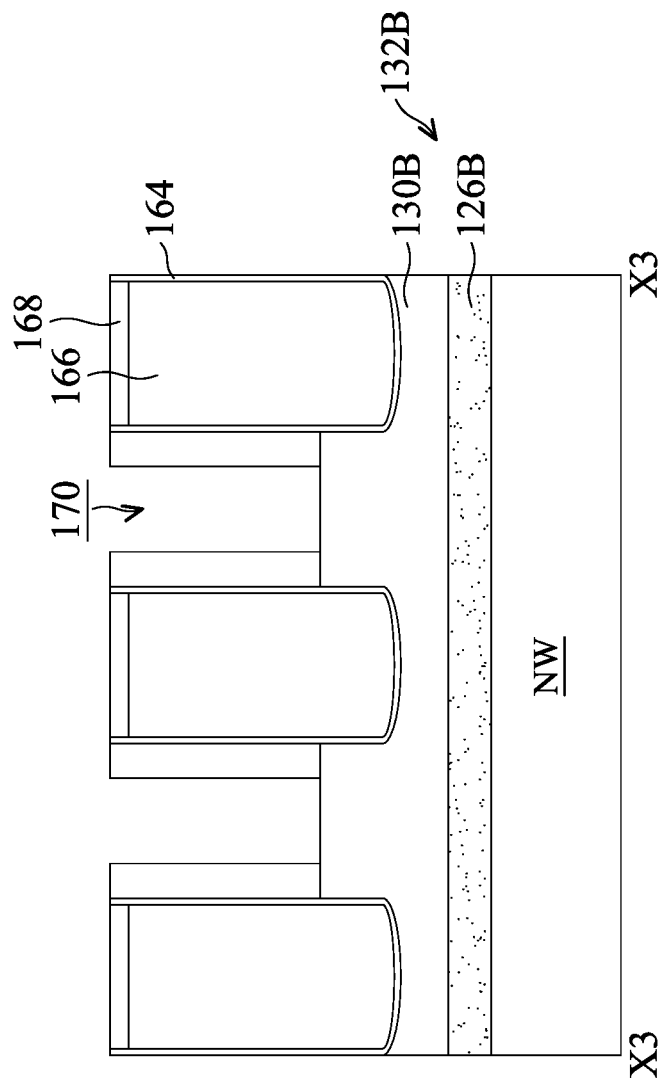
Figure 1R:
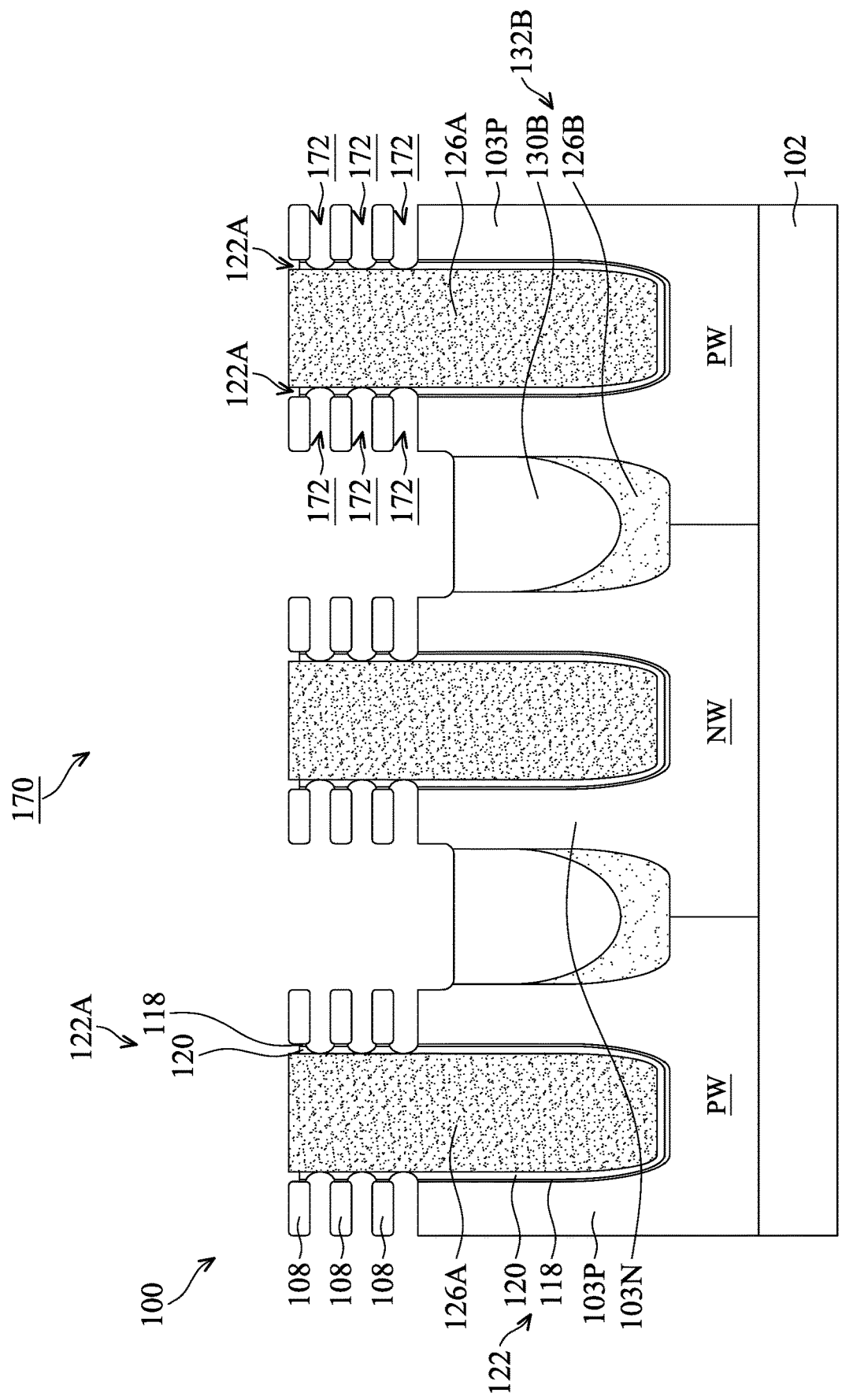
Figure 1S:
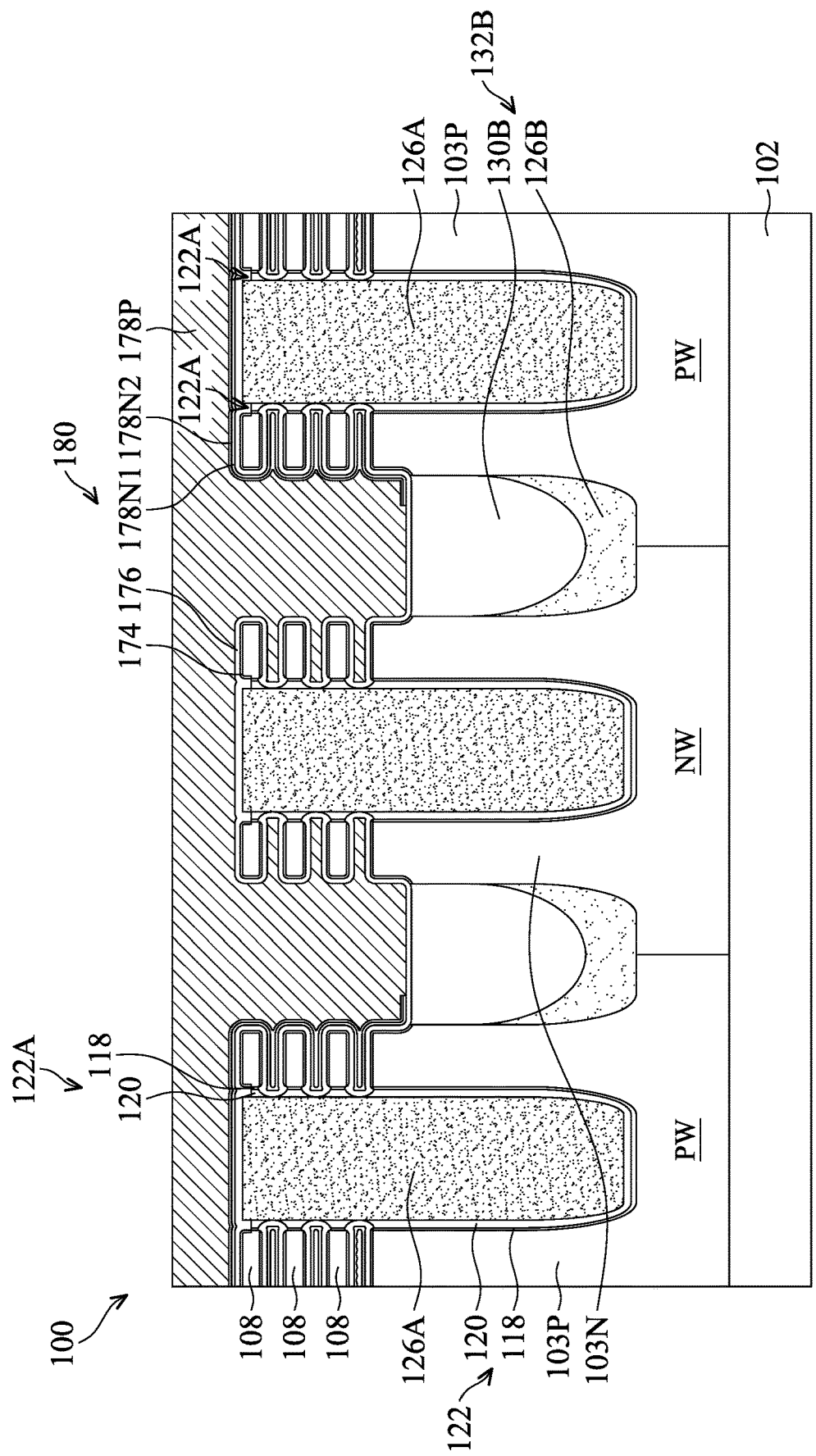
Figures 1, 1S, 2:
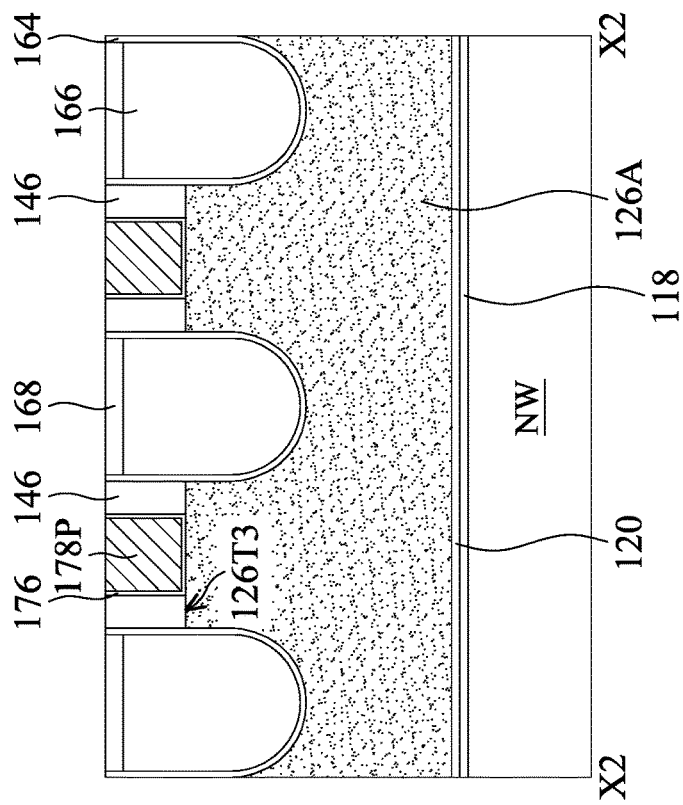
Figures 1, 1S:
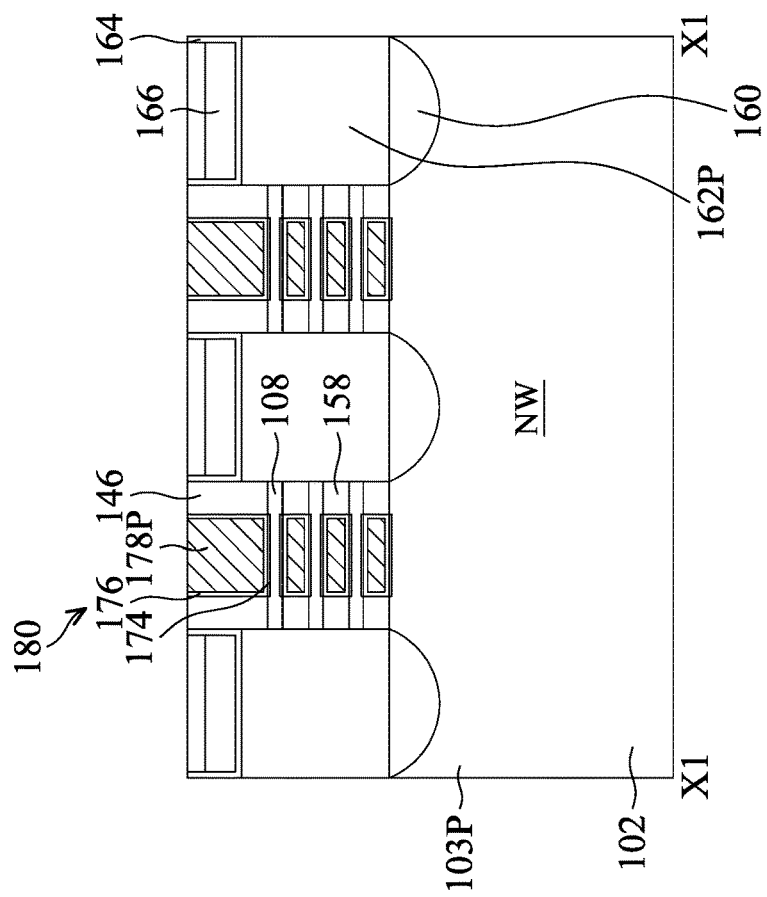
Figures 1, 1S, 2, 3:
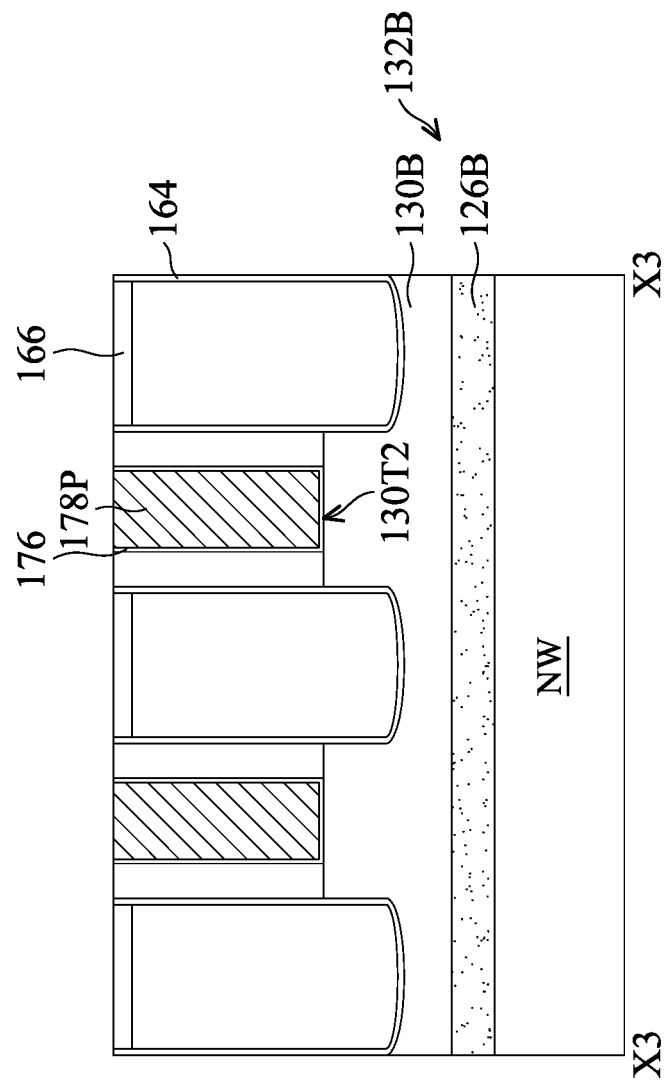
Figure 2:
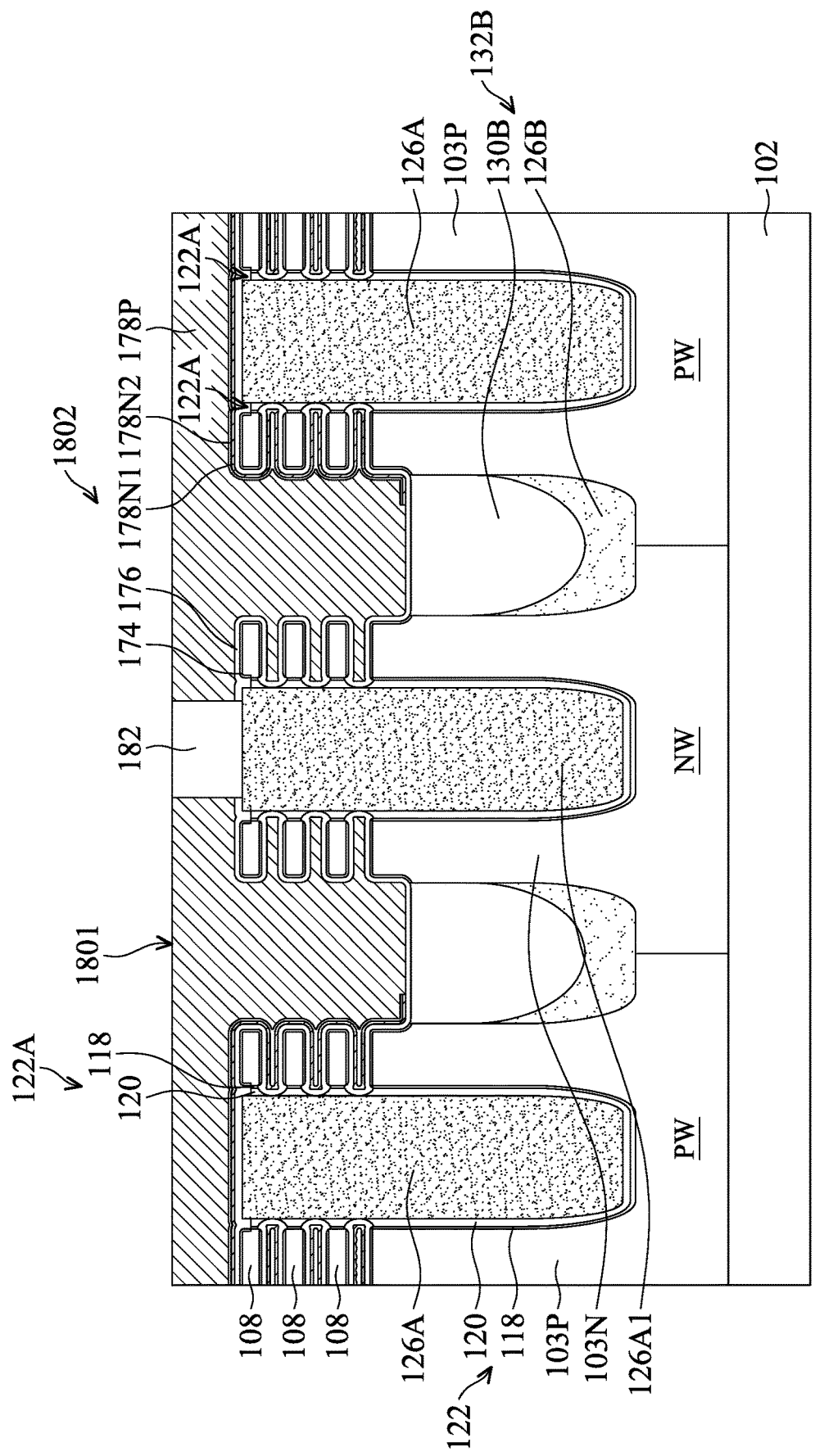

FIGS. 1A through 1S-3 are schematic views illustrating the formation of a semiconductor structure 100 at various intermediate stages, in accordance with some embodiments of the disclosure. FIG. 1A is a perspective view of a semiconductor structure 100 after the formation of an epitaxial stack, in accordance with some embodiments.

The semiconductor structure 100 includes a substrate 102. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

For a better understanding of the semiconductor structure 100, X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

An N-type well NW and p-type wells PW are formed in the substrate 102, as shown in FIG. 1A, in accordance with some embodiments. In some embodiments, the n-type well NW and the p-type wells PW have different electrically conductive types. The N-type well NW is located between the p-type wells PW, in accordance with some embodiments.

In some embodiments, the wells NW and PW are formed by ion implantation processes. For example, a patterned mask layer (such as a photoresist layer and/or a hard mask layer) is formed to cover regions of the substrate 102 where the p-type wells are predetermined to be formed, and then n-type dopants (such as phosphorus or arsenic) are implanted into the substrate 102, thereby forming the n-type well NW, in accordance with some embodiments. Afterward, the patterned mask layer may be removed. Similarly, a patterned mask layer (such as photoresist layer and/or hard mask layer) is formed to cover regions of the substrate 102 where the n-type well is predetermined to be formed, and then p-type dopants (such as boron or $BF_2$) are implanted into the substrate 102, thereby forming the p-type wells PW, in accordance with some embodiments. Afterward, the patterned mask layer may be removed.

In some embodiments, the respective concentrations of the dopants in the wells NW and PW are in a range from about $10^{16}/cm^{-3}$ to about $10^{18}/cm^{-3}$. In some embodiments, the ion implantation processes may be performed several times with different dosages and different energy intensities. In some embodiments, the ion implantation process may include an anti-punch through (APT) implant.

An epitaxial stack including alternating first semiconductor layers 106 and second semiconductor layer 108 is formed over the wells NW and PW using an epitaxial growth process, as shown in FIG. 1A, in accordance with some embodiments. The epitaxial growth process may be molecular beam epitaxy (MBE), metal organic chemical vapor deposition (MOCVD), or vapor phase epitaxy (VPE), or another suitable technique.

The first semiconductor layers 106 have a different lattice constant than the second semiconductor layers 108, in accordance with some embodiments. In some embodiments, the first semiconductor layers 106 and the second semiconductor layers 108 have different oxidation rates and/or etching selectivity. In some embodiments, the first semiconductor layers 106 are made of SiGe, where the percentage of germanium (Ge) in the SiGe is in a range of about 20 atomic % to about 50 atomic %, and the second semiconductor layers 108 are made of pure or substantially pure silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

In some embodiments, the thickness of each of the first semiconductor layers 106 is in a range of about 3 nm to about 20 nm, such as about 4 nm to about 12 nm. In some embodiments, the thickness of each of the second semiconductor layers 108 is in a range of about 3 nm to about 20 nm, such as about 4 nm to about 12 nm. The thickness of the second semiconductor layers 108 may be greater than, equal to, or less than the first semiconductor layers 106, which may depend on the amount of gate materials to be filled in spaces where the first semiconductor layers 106 are removed.

In some embodiments, the number of the first semiconductor layers 106 is one more than the number of the second semiconductor layers 108. That is, both the lowermost layer and the topmost layer of the epitaxial stack are the first semiconductor layers 106. Although four first semiconductor layers 106 and three second semiconductor layers 108 are shown in FIG. 1A, the numbers are not limited thereto. By adjusting the number of the semiconductor layers, a driving current of the resulting nanostructure device can be adjusted.

FIG. 1B is a perspective view of a semiconductor structure 100 after the formation of fin structures 104 (including 104A and 104B), in accordance with some embodiments. FIG. 1B-1 is a cross-sectional view of FIG. 1B taken along plane Y-Z, in accordance with some embodiments.

The epitaxial stack (including the first semiconductor layers 106 and the second semiconductor layers 108) and the underlying wells PW and NW are patterned into the fin structures 104, as shown in FIGS. 1B and 1B-1, in accordance with some embodiments. The fin structures 104A are located on the p-type wells PW, and the fin structures 104B are located on the n-type well NW, in accordance with some embodiments. In some embodiments, the fin structures 104A and 104B extend in the X direction. That is, the fin structures 104A and 104B have longitudinal axes parallel to the X direction, in accordance with some embodiments.

Each of the fin structures 104A and 104B is defined as several channel regions and several source/drain regions, where the channel regions and the source/drain regions are alternately arranged, in accordance with some embodiments. In this disclosure, a source/drain refers to a source and/or a drain. It is noted that in the present disclosure, a source and a drain are interchangeably used and the structures thereof are substantially the same. The X direction may also be referred to as the channel-extending direction. The current of the resulting semiconductor device (i.e., nanostructure transistor) flows in the X direction through the channel.

In some embodiments, the patterning process for forming the fin structures 104A and 104B includes forming patterned hard mask layers 110, 112 and 114 over the epitaxial stack. In some embodiments, the patterned hard mask layers 110 and 114 are made of oxide (such as silicon oxide), and the patterned hard mask layer 112 is made of nitride (such as silicon nitride). The patterning process further includes performing an etching process to remove portions of the epitaxial stack and the wells PW and NW uncovered by the patterned hard mask layers 110, 112 and 114, thereby forming trenches 116 (including 116A and 116B) and the fin structures 104 protruding from between the trenches 116, in accordance with some embodiments. The etching process may be an anisotropic etching process, e.g., dry plasma etching.

The trenches 116A are located directly above (or within, in the plane view) the wells PW or NW, and the trenches 116B are located on the boundaries between the p-type wells PW and the n-type well NW, in accordance with some embodiments. In some embodiments, the trenches 116A has a dimension D1 which is measured at the top surface of topmost second semiconductor layer 108 in the Y direction. In some embodiments, the dimension D1 is in a range from about 8 nm to about 200 nm, such as from about 10 nm to about 30 nm. In some embodiments, the trenches 116B has a dimension D2 which is measured at the top surface of topmost second semiconductor layer 108 in the Y direction. In some embodiments, the dimension D2 is in a range from about 8 nm to about 200 nm, such as from about 10 nm to about 30 nm. In some embodiments, the dimension D1 is substantially equal to the dimension D2. In alternative embodiments, the dimension D1 is wider or narrower than the dimension D2, and the difference between the dimension D1 and the dimension D2 is less than about 100 nm.

The portions of the p-type wells PW protruding from between the trenches 116 serves as lower fin elements 103P of the fin structures 104A, and the portions of the n-type well NW protruding from between the trenches 116 serves as the lower fin element 103N of the fin structures 104B, in accordance with some embodiments. A remainder of the epitaxial stack (including the first semiconductor layers 106 and the second semiconductor layers 108) serves as the upper fin elements of the fin structures 104A and 104B, in accordance with some embodiments. In some embodiments, the fin structures 104A and 104B may be also be referred to as active regions of the semiconductor structure 100 (which may also be referred to as an oxide definition (OD)).

The first semiconductor layers 106 of the fin structures 104A and 104B are configured as sacrificial layers and will be removed to form gaps to accommodate gate materials, and the second semiconductor layers 108 of the fin structures 104A and 104B will form nanostructures (e.g., nanowires or nanosheets) that laterally extend between source/drain features and serve as a channel for the resulting semiconductor devices (such as nanostructure transistors), in accordance with some embodiments. Gate stacks will be formed to surround the nanostructures.

FIG. 1C is a cross-sectional view of a semiconductor structure 100 after the formation of lining layers 118 and 120 taken along plane Y-Z, in accordance with some embodiments.

Lining layers 118 and 120 are sequentially formed over the semiconductor structure 100, as shown in FIG. 1C, in accordance with some embodiments. The lining layers 118 and 120 extends along the patterned hard mask layers 110, 112 and 114, the fin structures 104A and 104B and the wells PW and NW, in accordance with some embodiments. The lining layers 118 and 120 partially fill the trenches 116A and 116B, in accordance with some embodiments.

In some embodiments, the lining layers 118 and 120 are made of dielectric material such as silicon oxide ($SiO_2$), silicon nitride (SiN), silicon oxynitride (SiON), silicon carbon nitride (SiCN), silicon oxycarbonitride (SiOCN), oxygen-doped silicon carbide (SiC:O), and/or oxygen-doped silicon carbonitride (Si(O)CN). In some embodiments, the lining layer 118 and the lining layer 120 are made of different materials. For example, the lining layer 118 is made of oxide-based dielectric material (such as SiO), and the lining layer 120 is made of nitride-based dielectric material (such as SiN, SiON or SiOCN). In some embodiments, the lining layer 120 may has a better etching resistivity than the lining layer 118, and the lining layer 118 may be configured as a buffer layer to reduce the stress from the lining layer 120 applied to the fin structures 104.

In some embodiments, the lining layers 118 and 120 are conformally deposited using includes atomic layer deposition (ALD), CVD (such as plasma-enhanced CVD (PECVD), low-pressure CVD (LPCVD), or high density plasma CVD (HDP-CVD)), another suitable technique, or a combination thereof. In some embodiments, the overall thickness T1 of the lining layers 118 and 120 along the sidewalls of the fin structures 104 is in a range from about 0.5 nm to about 10 nm.

FIG. 1D is a cross-sectional view of a semiconductor structure 100 after the formation of mask patterns 124 taken along plane Y-Z, in accordance with some embodiments.

Mask patterns 124 are formed over the semiconductor structure 100 to cover the trenches 116A, as shown in FIG. 1D, in accordance with some embodiments. The mask patterns 124 overfill the trenches 116A, in accordance with some embodiments. The trenches 116B are uncovered by (or overlap with) the mask patterns 124, in accordance with some embodiments. In some embodiments, the mask patterns 124 are located directly above (or within, in the plane view) the wells PW or NW. In some embodiments, the mask patterns 124 have opposite edges (or sidewalls) 124E with respect to the Y direction. The edges 124E are located directly above the top surfaces of the fin structures 104 (or the patterned mask layers 114), in accordance with some embodiments.

In some embodiments, the mask patterns 124 are patterned photoresist masks formed by a photolithography process. The photolithography process can include forming a photoresist layer over the semiconductor structure 100 (for example, by spin coating), performing a pre-exposure baking process, performing an exposure process using a mask (or a reticle), performing a post-exposure baking process, and performing a developing process. During the exposure process, the photoresist layer is exposed to radiation energy (such as ultraviolet (UV) light, deep UV (DUV) light, or extreme UV (EUV) light), where the mask blocks, transmits, and/or reflects radiation to the photoresist layer depending on a mask pattern of the mask and/or mask type, such that an image is projected onto the photoresist layer that corresponds with the mask pattern. Since the photoresist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned photoresist layer forms the mask patterns 124.

In some embodiments, the mask patterns 124 include patterned bottom anti-reflective coating (BARC) masks. The BARC masks may be made of an inorganic material or an organic material (e.g., polymer, oligomer, or monomer). In some embodiments, the BARC masks are made of an organic material including carbon and oxygen, which is made of a cross-linked photo-sensitive material. In some embodiments, a BARC layer is deposited over the semiconductor structure 100, and patterned photoresist masks are form over the BARC layer using the photolithography process as described above. An etching process is performed to remove the portions of the BARC layer that are exposed from the patterned photoresist masks, thereby forming the mask patterns 124. The etching process may be an anisotropic etching process such as dry plasma etching.

FIG. 1E is a cross-sectional view of a semiconductor structure 100 after an etching process taken along plane Y-Z, in accordance with some embodiments.

An etching process is performed on the lining layers 118 and 120 using the mask patterns 124 to remove the portions of the lining layers 118 and 120 uncovered by the mask patterns 124, as shown in FIG. 1C, in accordance with some embodiments. The etching process is performed until the fin structures 104 and the wells PW and NW are exposed, in accordance with some embodiments. The etching process may be an anisotropic etching process such as dry plasma etching, an isotropic etching process such as dry chemical etching, remote plasma etching or wet chemical etching, or a combination thereof. The mask patterns 124 may be removed in the etching process or by an additional process (such as an ashing process).

The portions of the lining layers 118 and 120 filled in the trenches 116B are entirely removed while the portions of the lining layers 118 and 120 filled in the trenches 116A is left, in accordance with some embodiments. In some embodiments, the remaining portions of the lining layers 118 and 120 are referred to as dielectric liners 122. In some embodiments, each of the dielectric liners 122 are located directly above (or within, in the plane view) the wells PW or NW, and does not extend beyond the boundary between the wells PW and NW. In some embodiments, the mask patterns 124 has terminal 122E which are located directly above the top surfaces of the fin structures 104 (or the patterned mask layers 114). That is, the terminal 122E is located between the vertical extension liners of the sidewalls of the fin structures 104, in accordance with some embodiments.

The remaining portion of the trenches 116A has a dimension D1' which is measured at the top surface of topmost second semiconductor layer 108 in the Y direction, in accordance with some embodiments. In some embodiments, the dimension D1' is in a range from about 7.5 nm to about 119.5 nm, such as from about 9.5 nm to about 29.5 nm. The dimension D1' of the remaining portion of trenches 116A is less than the dimension D2 of the trenches 116B, in accordance with some embodiments. In some embodiments, the ratio (D1'/D2) of the dimension D1' to the dimension D2 is in a range from about 0.5 to about 0.95.

FIG. 1F is a cross-sectional view of a semiconductor structure 100 after the formation of a dielectric material 126 taken along plane Y-Z, in accordance with some embodiments.

A dielectric material 126 is formed over the semiconductor structure 100 to fill the trenches 116A and 116B, as shown in FIG. 1F, in accordance with some embodiments. The trenches 116A are overfilled with the dielectric material 126, in accordance with some embodiments. The trenches 116B are partially filled with the dielectric material 126, and voids 128B (which can also be referred to as a seam) are formed in the dielectric material 126 within the trenches 116B, in accordance with some embodiments.

In some embodiments, the dielectric material 126 is made of dielectric material such as silicon nitride (SiN), silicon oxide ($SiO_2$), silicon oxynitride (SiON), silicon carbon nitride (SiCN), silicon oxycarbonitride (SiOCN), oxygen-doped silicon carbide (SiC:O), oxygen-doped silicon carbonitride (Si(O)CN), or a combination thereof. In some embodiments, the dielectric material 126 and the lining layer 120 different materials. For example, the dielectric material 126 is made of SiN and the lining layer 120 is made of SiON, SiCN or SiOCN. In some embodiments, the dielectric material 126 is deposited using ALD, CVD such as LPCVD, PECVD, HDP-CVD, or high aspect ratio process (HARP), another suitable technique, or a combination thereof.

FIG. 1F-1 an enlarge view of FIG. 1F to illustrate the deposition process for forming the dielectric material 126, in accordance with some embodiments. During the deposition process, in the trench 116A, a first portion 1261 of the dielectric material 126 formed on the sidewall of the fin structure 104B (or 104A) and a second portion 1262 of the dielectric material 126 formed on the sidewall of the adjacent fin structure 104B (or 104A) gradually approach each other, in accordance with some embodiments. The remaining space of the trench 116A gradually shrinks as the deposition proceeds. The deposition process is performed until the first portion 1261 and the second portion 1262 entirely merged, in accordance with some embodiments. A notch 128A is formed over the merged portion (1261 and 1262) of the dielectric material 126 within the trench 116A, in accordance with some embodiments. The bottom 128A1 of the notch 128A is located higher than the top surface of the topmost first semiconductor layer 106, and higher than the top surface of the patterned mask layer 114.

In the trench 116B, when the deposition process is complete, a third portion 1263 of the dielectric material 126 formed on the sidewall of the fin structure 104B (or 104A) has not yet entirely merged with a fourth portion 1264 of the dielectric material 126 formed on the sidewall of the adjacent fin structure 104A (or 104B), because the dimension D2 of the trenches 116B is greater than the dimension D1' of the trenches 116A, in accordance with some embodiments. The remaining space of the trench 116B between the portions 1263 and 1264 forms a void 128B, in accordance with some embodiments. The void 128B remains in the portion of the dielectric material 126 that is within the trench 116B. In some embodiments, the bottom 128B1 of the void 128B is located lower than the bottom surface of the lowermost first semiconductor layer 106.

FIG. 1G is a cross-sectional view of a semiconductor structure 100 after an etching process taken along plane Y-Z, in accordance with some embodiments.

An etching process is performed to recess the dielectric material 126 until the dielectric liner 122 (or the lining layer 120) is exposed, as shown in FIG. 1G, in accordance with some embodiments. The etching process may be an isotropic etching process such as dry chemical etching, remote plasma etching or wet chemical etching, an anisotropic etching process such as dry plasma etching, or a combination thereof.

In the etching process, the etchant may be introduced into the voids 128B and laterally (e.g., in the Y direction) etches away the portions (e.g., 1263 and 1264) of the dielectric material 126 within the trenches 116B, in accordance with some embodiments. As a result, the etching amount of the dielectric material 126 within the trenches 116B is greater than the etching amount of the dielectric material 126 within the trenches 116A, in accordance with some embodiments. The trenches 116B are reopened and denoted as 116B', in accordance with some embodiments.

After the etching process, the dielectric material 126 within the trenches 116A is referred to dielectric walls 126A, in accordance with some embodiments. In some embodiments, the dielectric walls 126A extend in the X direction. That is, the dielectric walls 126A have longitudinal axes parallel to the X direction, in accordance with some embodiments. In some embodiments, the top surfaces 126T1 of the dielectric walls 126A have concaved profiles, and the lowermost points of the top surfaces 126T1 are located at a higher position than the top surface of the topmost first semiconductor layer 106.

In some embodiments, the dielectric walls 126A have a thickness T2 (in the Z direction), measured from the lowermost point of the top surface 126T1 to the bottom of the dielectric wall 126A. In some embodiments, the thickness T2 is in a range from about 10 nm to about 150 nm. In some embodiments, the dielectric walls 126A are nested within the dielectric liners 122 and in direct contact with the dielectric liners 122.

After the etching process, the dielectric material 126 within the trenches 116B is referred to lower isolation layers 126B, in accordance with some embodiments. In some embodiments, the top surfaces 126T2 of the lower isolation layers 126B have concaved profiles, and the topmost point of the top surface 126T2 is located at a lower position than the bottom surface of the lowermost first semiconductor layer 106.

In some embodiments, the lower isolation layers 126B have a thickness T3 (in the Z direction), measured from the lowermost point of the top surface 126T2 to the bottom of the lower isolation layer 126B. In some embodiments, the thickness T3 is less than the thickness T2 and may be less than 50 nm. In some embodiments, the lower isolation layers 126B are in direct contact with the fin structures 104A and 104B. In alternative embodiments, the dielectric material 126 may be entirely removed from the trenches 116B.

FIG. 1H is a cross-sectional view of a semiconductor structure 100 after formation of an insulating material 130 taken along plane Y-Z, in accordance with some embodiments.

An insulating material 130 is formed over the semiconductor structure 100 to overfill the trenches 116B', as shown in FIG. 1H, in accordance with some embodiments. In some embodiments, the insulating material 130 includes silicon oxide ($SiO_2$), silicon nitride (SiN), silicon oxynitride (SiON), another suitable insulating material, multilayers thereof, or a combination thereof. In some embodiments, the insulating material 130 is formed using CVD such as LPCVD, PECVD, HDP-CVD, HARP, FCVD (flowable CVD), ALD, another suitable technique, or a combination thereof. In some embodiments, the insulating material 130 and the lower isolation layer 126B are made of different materials. For example, the insulating material 130 is made of oxide-based dielectric material (such as SiO), and the lower isolation layer 126B is made of nitride-based dielectric material (such as SiN, SiON or SiOCN). In some embodiments, the dielectric constant of the lower isolation layer 126B is greater than the dielectric constant of the insulating material 130.

A planarization process is then performed on the insulating material 130 until the topmost second semiconductor layers 108 are exposed, as shown in FIG. 1H, in accordance with some embodiments. In some embodiments, the planarization process is an etching-back process such as dry plasma etching and/or wet chemical etching, and/or a chemical mechanical polishing (CMP) process. In some embodiments, the patterned mask layers 114, 112 and 110, the topmost first semiconductor layers 106, and the portions of the dielectric wall 126A and the dielectric layers 122 above the topmost second semiconductor layer 108 are also removed. After the planarization process, the top surface 126T3 of the dielectric wall 126A, the top of the dielectric liner 122, the top surface of the topmost second semiconductor layer 108, and the top surface 130T1 of the insulating material 130 are substantially coplanar.

FIG. 1I is a cross-sectional view of a semiconductor structure 100 after formation of an isolation structure 132B and a dummy gate dielectric layer 134 taken along plane Y-Z, in accordance with some embodiments.

The insulating material 130 is recessed using an etching process (such as anisotropic etching process such as dry plasma etching, an isotropic etching process such as dry chemical etching, remote plasma etching or wet chemical etching, or a combination thereof) to expose the upper portion of one sidewall of each of the fin structures 104A and 104B, in accordance with some embodiments. The upper portion of the trenches 116B' is opened again and denoted as 116B", in accordance with some embodiments. The trenches 116B" have bottom surfaces lower than the bottom surface of the lowermost first semiconductor 106, in accordance with some embodiments.

The remainder of the insulating material 130 is referred to as an upper isolation layers 130B, as shown in FIG. 1I, in accordance with some embodiments. The upper isolation layers 130B and the lower isolation layers 126B combine to form isolation structures 132B, in accordance with some embodiments. The isolation structures 132B are located on the boundaries between the p-type wells PW and the n-type well NW, in accordance with some embodiments. The fin structures 104 are located between the dielectric walls 126A and the isolation structures 132B, in accordance with some embodiments. The isolation structure 132B may also be referred to as a shallow trench isolation (STI) feature.

In some embodiments, the upper isolation layers 130B has convex bottom surface that are interfaced and mate with the concave top surface of the lower isolation layers 126B. In some embodiments, both the upper isolation layers 130B and the lower isolation layers 126B are in contact with the lower fin elements 103N and 103P.

In some embodiments, the dielectric walls 126A have a thickness T4 (in the Z direction). In some embodiments, the thickness T4 is in a range from about 10 nm to about 100 nm. In some embodiments, the upper isolation layers 130B have a thickness T5 (in the Z direction), measured from the lowermost point of the bottom surface to the top surface of the upper isolation layers 130B. In some embodiments, the thickness T5 is less than the thickness T4 and may be less than 50 nm.

A dummy gate dielectric layer 134 is conformally form along the semiconductor structure 100, as shown in FIG. 1I, in accordance with some embodiments. The dummy gate dielectric layer 134 extends along and covers the top surfaces and the exposed sidewalls of the fin structures 104, the top surfaces 126T3 of the dielectric walls 126A and the top surfaces 130T2 of the isolation structures 132B, in accordance with some embodiments.

In some embodiments, the dummy gate dielectric layer 134 is made of one or more dielectric materials, such as silicon oxide (SiO), silicon nitride (SiN), silicon oxynitride (SiON), $HfO_2$, HfZrO, HfSiO, HfTiO, HfAlO, or a combination thereof. In some embodiments, the dielectric material is formed using ALD, CVD, thermal oxidation, physical vapor deposition (PVD), another suitable technique, or a combination thereof.

FIG. 1J is a perspective view of a semiconductor structure 100 after the formation of dummy gate structures 138, in accordance with some embodiments. FIG. 1J-1 is a plane view of the semiconductor structure 100 of FIG. 1J, in accordance with some embodiments of the disclosure. FIG. 1J-1 illustrates reference cross-sections that are used in later figures. Cross-section X1-X1 is in a plane parallel to the X direction and through the fin structure 104B. Cross-section X2-X2 is in a plane parallel to the X direction and through the dielectric wall 126A. Cross-section X3-X3 is in a plane parallel to the X direction and through the isolation structure 132B. FIGS. 1J-2, 1J-3 and 1J-4 illustrate cross-sectional views of the semiconductor structure 100 of FIG. 1J corresponding to Cross-section X1-X1, Cross-section X2-X2 and Cross-section X3-X3, in accordance with some embodiments.

Dummy gate electrode layers 136 are formed over the dummy gate dielectric layers 134, as shown in FIGS. 1J to 1J-4, in accordance with some embodiments. The dummy gate electrode layers 136 and the dummy gate dielectric layers 134 combine to form dummy gate structures 138, in accordance with some embodiments. In some embodiments, the dummy gate electrode layer 136 is made of semiconductor material such as polysilicon and/or poly-silicon germanium. In some embodiments, the dummy gate electrode layer 136 is made of a conductive material such as metallic nitrides, metallic silicides, metals, or a combination thereof.

In some embodiments, the formation of the dummy gate structure 138 includes depositing a material for the dummy gate electrode layers 136 over the dummy gate dielectric layers 134 using CVD and/or another suitable technique, planarizing the material for the dummy gate electrode layer 136, and patterning the material for the dummy gate electrode layer 136 and the dummy gate dielectric layers 134 into the dummy gate structure 138. The patterning process includes forming patterned hard mask layers 140 and 142 over the material for the dummy gate electrode layer 136, in accordance with some embodiments. In some embodiments, the patterned hard mask layers 140 is a nitride layer (such as SiON and/or SiN), and the patterned hard mask layers 142 is an oxide layer (such as SiO). The patterned hard mask layers 140 and 142 correspond to and overlap the channel regions of the fin structures 104, in accordance with some embodiments. The material for the dummy gate electrode layer 136 and the dummy gate dielectric layers 134, uncovered by the patterned hard mask layers 140 and 142, are etched away until the source/drain regions of the fin structures 104 are exposed, in accordance with some embodiments.

The dummy gate structures 138 are configured as sacrificial structures and will be replaced with the final gate stacks, in accordance with some embodiments. In some embodiments, the dummy gate structures 138 extend in the Y direction over the channel regions of the fin structures 104. That is, the dummy gate structures 138 have longitudinal axes parallel to the Y direction, and the Y direction may also be referred to as the gate-extending direction, in accordance with some embodiments. The dummy gate structures 138 partially cover the top surface and one sidewall of each of the fin structures 104, in accordance with some embodiments. The other sidewall of the each of the fin structures 104 is entirely covered by the dielectric liner 122, as shown in FIGS. 1J and 1J-1, in accordance with some embodiments.

FIG. 1K is a perspective view of a semiconductor structure 100 after the formation of a spacer layer 144, in accordance with some embodiments.

A spacer layer 144 is conformally formed over the semiconductor structure 100, as shown in FIG. 1K, in accordance with some embodiments. In some embodiments, the spacer layer 144 is made of a dielectric material, such as silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), a multilayer thereof, or a combination thereof, or a combination thereof. In some embodiments, the spacer layer 144 is made of low-k dielectric materials. For example, the dielectric constant (k) values of the gate spacer layers 120 may be lower than a k-value of silicon oxide (SiO), such as lower than 4.2, equal to or lower than about 3.9, such as in a range from about 3.5 to about 3.9. In some embodiments, the spacer layer 144 is deposited using ALD, CVD (such as PECVD, LPCVD or HARP), another suitable technique, or a combination thereof.

FIG. 1L is a perspective view of a semiconductor structure 100 after the formation of gate spacer layers 146, fin spacer layers 148, source/drain recesses 150, and notches 156, in accordance with some embodiments. FIGS. 1L-1, 1L-2 and 1L-3 illustrate cross-sectional views of the semiconductor structure 100 of FIG. 1L corresponding to Cross-section X1-X1, Cross-section X2-X2 and Cross-section X3-X3, in accordance with some embodiments.

An etching process is performed on the spacer layer 144 until the fin structures 104A and 104B are exposed, in accordance with some embodiments. After the etching process, the vertical portions of the spacer layer 144 left on the opposite sidewalls of the dummy gate structures 138 serve as gate spacer layers 146, as shown in FIGS. 1L to 1L-3, in accordance with some embodiments. Vertical portions of the spacer layer 144 left on the sidewalls of the fin structures 104A and 104B over the isolation structure 132B serve as fin spacer layers 148, as shown in FIG. 1L, in accordance with some embodiments. In some embodiments, the etching process may be an anisotropic etching process (such as dry plasma etching).

An etching process is performed to recess the source/drain regions of the fin structures 104A and 104B, thereby forming source/drain recesses 150 in the fin structures 104A and 104B, as shown in FIGS. 1L and 1L-1, in accordance with some embodiments. The etching process may be an anisotropic etching process such as dry plasma etching, an isotropic etching process such as dry chemical etching, remote plasma etching or wet chemical etching, or a combination thereof. The gate spacer layers 146 and the dummy gate structures 138 (and overlying patterned mask layers 140 and 142) may serve as etch masks so that the source/drain recesses 150 may be formed self-aligned on opposite sides of the dummy gate structures 138, in accordance with some embodiments. In some embodiments, the etching process is performed without the need for an additional photolithography process. The source/drain recesses 150 extend into the lower fin elements 103N and 103P.

In the etching process, the dielectric walls 126A and the dielectric liners 122 are also recessed, thereby forming recesses 152, as shown in FIGS. 1L and 1L-2, in accordance with some embodiments. In some embodiments, the recesses 152 are shallower than the source/drain recesses 150. In some embodiments, the dielectric walls 126A have top surfaces 126T3' exposed from the recesses 152, and the top surfaces 126T3' have concave profiles.

In the etching process, the upper isolation layers 130B of the isolation structures 132B are also recessed, thereby forming recesses 154, as shown in FIGS. 1L and 1L-3, in accordance with some embodiments. In some embodiments, the bottoms of the recesses 154 are located at a lower level than the bottoms of the source/drain recesses 150, and the bottoms of the source/drain recesses 150 are located at a lower level than the bottoms of the recesses 152. In some embodiments, the upper isolation layers 130B have top surfaces 130T2' exposed from the recesses 154, and the top surfaces 130T2' have concave profiles.

Afterward, an isotropic etching process is performed to laterally recess, from the source/drain recesses 150 toward the channel region, the first semiconductor layers 106 of the fin structures 104A and 104B to form notches 156, as shown in FIGS. 1L and 1L-1, in accordance with some embodiments. In some embodiments, the isotropic etching process may be dry chemical etching, remote plasma etching, wet chemical etching, another suitable technique, or a combination thereof. The notches 156 are formed between adjacent second semiconductor layers 108 and between the lowermost second semiconductor layer 108 and the lower fin element 103P (or 103N), in accordance with some embodiments. In some embodiments, the notches 156 are located directly below the gate spacer layers 146.

FIG. 1M is a perspective view of a semiconductor structure 100 after the formation of inner spacer layers 158, in accordance with some embodiments.

Inner spacer layers 158 are formed in the notches 156, as shown in FIG. 1M, in accordance with some embodiments. The inner spacer layers 158 are formed to abut the exposed sidewalls of the first semiconductor layers 106, in accordance with some embodiments. In some embodiments, the inner spacer layers 158 are formed directly below the gate spacer layers 146, in accordance with some embodiments. In some embodiments, the inner spacer layers 158 are located between adjacent second semiconductor layers 108 and between the lowermost second semiconductor layer 108 and the lower fin element 103P (or 103N).

The inner spacer layers 158 interpose subsequently formed source/drain features and gate stack to avoid the source/drain features and the gate stack from being in direct contact and are configured to reduce the parasitic capacitance between the gate stack and the source/drain features (i.e., Cgs and Cgd), in accordance with some embodiments. In some embodiments, the inner spacer layers 158 are made of a silicon-containing dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the inner spacer layers 158 are made of low-k dielectric materials. For example, the dielectric constant of the inner spacer layers 158 may be lower than a k-value of silicon oxide (SiO), such as lower than 4.2, equal to or lower than about 3.9, such as in a range of about 3.5 to about 3.9.

The formation of the inner spacer layers 158 includes depositing a dielectric material for the inner spacer layers 158 over the semiconductor structure 100 to overfill the notches 156, and then etching back the dielectric material to remove the dielectric material outside the notches 156. Portions of the dielectric material left in the notches 156 serve as inner spacer layers 158, in accordance with some embodiments. In some embodiments, the deposition process includes ALD, CVD (such as PECVD, LPCVD or HARP), another suitable technique, or a combination thereof. In some embodiments, the etching back process includes an anisotropic etching process such as dry plasma etching, an isotropic etching process such as dry chemical etching, remote plasma etching or wet chemical etching, or a combination thereof.

FIG. 1N is a perspective view of a semiconductor structure 100 after the formation of undoped epitaxial layers 160 and source/drain features 162 (162N and 162P), in accordance with some embodiments.

Undoped epitaxial layers 160 are formed in the source/drain recesses 150 over the lower fin elements 103P and 103N, using an epitaxial growth process, as shown in FIG. 1N, in accordance with some embodiments. The epitaxial growth process may be MBE, MOCVD, or VPE, another suitable technique, or a combination thereof. In some embodiments, the undoped epitaxial layers 160 may be intrinsic semiconductor material such as silicon, silicon germanium and/or another suitable semiconductor material. For example, an impurity (or an n-type dopant and/or a p-type dopant) in the undoped epitaxial layers 160 has a concentration of less than about $10^{14}$ cm$^{-3}$. In some embodiments, the undoped epitaxial layers 160 are configured as an insulating layer to reduce leakage between adjacent devices from through the substrate 102.

Source/drain features 162 (162N and 162P) are formed over the undoped epitaxial layers 160 in the source/drain recesses 150, as shown in FIG. 1N, in accordance with some embodiments. The source/drain features 162N are formed in the p-type wells PW, and the source/drain features 162P are formed in the n-type well NW, in accordance with some embodiments. The source/drain features 162 are formed on opposite sides of the dummy gate structures 138, in accordance with some embodiments. The source/drain features 162 are formed to abut the sidewalls of the second semiconductor layers 108, in accordance with some embodiments. In some embodiments, the source/drain features 162N have a different electrically conductive type than the source/drain features 162P. The formation may include one or more epitaxial growth processes. These epitaxial growth processes may be MBE, MOCVD, or VPE, another suitable technique, or a combination thereof.

In some embodiments, the source/drain features 162N and the source/drain features 162P may be formed separately. For example, a patterned mask layer (such as photoresist layer and/or hard mask layer) may be formed to cover the semiconductor structure 100 over the n-type well NW, and then the source/drain features 162N are grown. Afterward, the patterned mask layer may be removed. Similarly, a patterned mask layer (such as photoresist layer and/or hard mask layer) is formed to cover the semiconductor structure 100 over the p-type well PW, and then the source/drain features 162P are grown. Afterward, the patterned mask layer may be removed.

In some embodiments, the source/drain features 162N and 162P are in-situ doped during the epitaxial processes. In some embodiments, the source/drain features 162N are doped with the n-type dopant during the epitaxial growth process. For example, the n-type dopant may be phosphorous (P) or arsenic (As). For example, the n-type source/drain features 162N may be the epitaxially grown silicon phosphorous (SiP), silicon carbon (SiC), silicon phosphorous carbon (SiPC), silicon phosphorous arsenic (SiPAs), silicon arsenic (SiAs), silicon (Si) or a combination thereof doped with phosphorous and/or arsenic. In some embodiments, the concentrations of the dopant (e.g., P) in the source/drain features 162N are in a range from about $2 \times 10^{19}$ cm$^{-3}$ to about $3 \times 10^{21}$ cm$^{-3}$.

In some embodiments, the source/drain features 162P are doped with the p-type dopant during the epitaxial growth process. For example, the p-type dopant may be boron (B) or $BF_2$. For example, the p-type source/drain features 162P may be the epitaxially grown silicon germanium (SiGe), silicon germanium carbon (SiGeC), germanium (Ge), silicon (P) or a combination thereof doped with boron (B). In some embodiments, the concentrations of the dopant (e.g., B) in the source/drain features 162P are in a range from about $1 \times 10^{19}$ cm$^{-3}$ to about $6 \times 10^{20}$ cm$^{-3}$. In some embodiments, the n-type source/drain features 162N and the p-type source/drain features 162P are made of different epitaxial materials. For example, the n-type source/drain features 162N are made of SiP, and the p-type source/drain features 162P are made of SiGe.

FIG. 1O is a perspective view of a semiconductor structure 100 after the formation of a contact etching stop layer (CESL) 164 and an interlayer dielectric layer 166, in accordance with some embodiments. FIGS. 1O-1, 1O-2 and 1O-3 illustrate cross-sectional views of the semiconductor structure 100 of FIG. 1O corresponding to Cross-section X1-X1, Cross-section X2-X2 and Cross-section X3-X3, in accordance with some embodiments.

A contact etching stop layer 164 is conformally formed over the semiconductor structure 100, as shown in FIGS. 1O to 1O-3, in accordance with some embodiments. The contact etching stop layer 164 extends along and covers the surfaces of the source/drain features 162, in accordance with some embodiments. The contact etching stop layer 164 further extends along and covers the recessed top surfaces 126T3' of the dielectric walls 126A and the recessed top surfaces 130T2' of the isolation structures 132B, in accordance with some embodiments.

In some embodiments, the contact etching stop layer 164 is made of dielectric material, such as silicon nitride (SiN), silicon oxynitride (SiON), silicon oxide (SiO$_2$), silicon oxynitride (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 164 is globally and conformally deposited over the semiconductor structure 100 using CVD (such as LPCVD, PECVD, HDP-CVD, or HARP), ALD, another suitable method, or a combination thereof.

Afterward, an interlayer dielectric layer 166 is formed over the contact etching stop layer 164, as shown in FIGS. 1O to 1O-3, in accordance with some embodiments. The interlayer dielectric layer 166 fills spaces the between the dummy gate structures 138, in accordance with some embodiments. The interlayer dielectric layer 166 further fills the recesses 152 and recesses 154 (FIG. 1M), in accordance with some embodiments.

In some embodiments, the interlayer dielectric layer 166 is made of dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the interlayer dielectric layer 166 and the contact etching stop layer 164 are made of different materials and have a great difference in etching selectivity. In some embodiments, the dielectric material for the interlayer dielectric layer 166 is deposited using such as CVD (such as HDP-CVD, PECVD, HARP or FCVD), another suitable technique, or a combination thereof.

The dielectric materials for the contact etching stop layer 164 and the interlayer dielectric layer 166 formed above the upper surface of the dummy gate electrode layer 136 are removed using such as CMP until the dummy gate electrode layer 136 is exposed, in accordance with some embodiments. In some embodiments, the patterned hard mask layers 140 and 142 are also removed. In some embodiments, the top surface of the interlayer dielectric layer 166, the top surfaces of the dummy gate electrode layers 136 and the top surfaces of the gate spacer layers 146 are substantially coplanar.

FIG. 1P is a perspective view of a semiconductor structure 100 after the formation of gate trenches 170, in accordance with some embodiments.

An etching process is performed on the interlayer dielectric layer 166 to form a recess, and then a dielectric capping layer 168 is formed in the interlayer dielectric layer 166 over the interlayer dielectric layer 166, as shown in FIG. 1P, in accordance with some embodiments. In some embodiments, the dielectric capping layer 168 is made of dielectric material such as silicon nitride (SiN), silicon oxynitride (SiON), silicon oxide (SiO$_2$), silicon carbide (SiC), silicon oxycarbonitride (SiOCN), oxygen-doped silicon carbide (SiC:O), oxygen-doped silicon carbonitride (Si(O)CN), or a combination thereof. In some embodiments, the dielectric capping layer 168 and the interlayer dielectric layer 166 are made of different materials. For example, the dielectric capping layer 168 is made of nitride-based dielectric material (such as SiN, SiON or SiOCN) and the interlayer dielectric layer 166 is made of oxide-based dielectric material (such as SiO).

The dielectric material for the dielectric capping layer 168 above the upper surface of the dummy gate electrode layer 136 is removed using such as CMP until the dummy gate electrode layer 136 is exposed, in accordance with some embodiments. In some embodiments, the top surface of the dielectric capping layer 168, the top surfaces of the dummy gate electrode layers 136 and the top surfaces of the gate spacer layers 146 are substantially coplanar. In some embodiments, the dielectric capping layer 168 may has a better etching resistivity than the interlayer dielectric layer 166, and thus protect the interlayer dielectric layer 166 in subsequent etching process from being removed.

The dummy gate structures 138 are removed using one or more etching processes to form gate trenches 170, as shown in FIG. 1P, in accordance with some embodiments. In some embodiments, the gate trenches 170 expose the channel regions of the fin structures 104A and 104B. In some embodiments, the gate trenches 170 expose one sidewall of each of the fin structures 104 while the other sidewall of the each of the fin structures 104 is covered by the dielectric liner 122.

In some embodiments, the gate trenches 170 further expose the top surfaces 126T3 of the dielectric walls 126A and the top surfaces 130T2 of the isolation structures 132B. In some embodiments, the gate trenches 170 also expose the inner sidewalls of the gate spacer layers 146 facing the channel region.

In some embodiments, the etching process includes one or more etching processes. For example, when the dummy gate electrode layer 136 is made of polysilicon, a wet etchant such as a tetramethylammonium hydroxide (TMAH) solution may be used to selectively remove the dummy gate electrode layer 136. For example, the dummy gate dielectric layer 134 may be thereafter removed using a plasma dry etching, a dry chemical etching, and/or a wet etching.

FIG. 1Q is a cross-sectional view of a semiconductor structure 100 after the formation of nanostructures, in accordance with some embodiments. FIGS. 1Q-1, 1Q-2 and 1Q-3 illustrate cross-sectional views of the semiconductor structure 100 of FIG. 1Q corresponding to Cross-section X1-X1, Cross-section X2-X2 and Cross-section X3-X3, in accordance with some embodiments.

An etching process is performed to laterally remove, from the gate trench 170, the first semiconductor layers 106 of the fin structures 104A and 104B to form gaps 172, as shown in FIGS. 1Q and 1Q-1, in accordance with some embodiments. In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions. In some embodiments, the inner spacer layers 158 serve an etching stop layer in the etching process, which may protect the source/drain features 162 from being damaged.

The gaps 172 are formed between adjacent second semiconductor layers 108 and between the lowermost second semiconductor layer 108 and the lower fin element 103P (or 103N), in accordance with some embodiments. After the etching processes, the three main surfaces of each of the second semiconductor layers 108 are exposed, while another main surface of each of the second semiconductor layers 108 is covered by the dielectric liner 122, as shown in FIG. 1Q, in accordance with some embodiments. The exposed second semiconductor layers 108 form six sets of nanostructures 108, in accordance with some embodiments. Each set includes three nanostructures 108 vertically stacked and spaced apart from one other, in accordance with some embodiments. As used herein, the term "nanostructures" refers to the semiconductor layers that are cylindrical, bar shaped and/or sheet shaped. The nanostructures 108 function as channels of the resulting semiconductor devices (e.g., nanostructure transistors such as GAA transistors), in accordance with some embodiments.

In some embodiments, the gaps 172 further expose the inner sidewalls of the inner spacer layers 158 facing the channel region, as shown in FIG. 1Q-1. In some embodiments, the gaps 172 further expose the dielectric liners 122, as shown in FIG. 1Q. In some embodiments, the top surface 126T3 of the dielectric wall 126A is substantially level with the top surface of the topmost nanostructure 108. In some embodiments, the structure formed from the two sets of nanostructures 108 and the dielectric wall 126 therebetween may be referred to as a fork-sheet structure.

FIG. 1R is a cross-sectional view of a semiconductor structure 100 after the formation of a trimming process, in accordance with some embodiments.

A trimming process is performed on the dielectric liners 122, thereby enlarging the gaps 172, as shown in FIG. 1R, in accordance with some embodiments. The trimming process is an etching process, which laterally etches, from the gaps 172, the dielectric liners 122, in accordance with some embodiments. The etching process is performed until the dielectric walls 126A are exposed, in accordance with some embodiments. The etching process may be an isotropic etching process such as dry chemical etching, remote plasma etching or wet chemical etching, or a combination thereof.

In some embodiments, the corners of the nanostructures 108 facing the dielectric walls 126A may be exposed from the gaps 172. Portions of the dielectric liners 122 left between the nanostructures 108 and the dielectric walls 126A are referred to as wall spacers 122A, in accordance with some embodiments. The space between the nanostructures 108 and the dielectric walls 126A may be referred to as an end-cap, and the wall spacers 122A may also be referred to as end cap dielectric layers. The dimension of the end-cap is substantially equal to the thickness T1 (FIG. 1C) of the dielectric liner 122, in accordance with some embodiments.

FIG. 1S is a cross-sectional view of a semiconductor structure 100 after the formation of final gate stacks 180, in accordance with some embodiments. FIGS. 1S-1, 1S-2 and 1S-3 illustrate cross-sectional views of the semiconductor structure 100 of FIG. 1S corresponding to Cross-section X1-X1, Cross-section X2-X2 and Cross-section X3-X3, in accordance with some embodiments.

Interfacial layer 174 is formed on the exposed surfaces of the nanostructures 108 and the lower fin elements 103N and 103P, as shown in FIGS. 1S and 1S-1, in accordance with some embodiments. The interfacial layer 174 surrounds the nanostructures 108, in accordance with some embodiments. In some embodiments, the interfacial layer 174 is made of a chemically formed silicon oxide. In some embodiments, the interfacial layer 174 is formed using one or more cleaning processes such as including ozone ($O_3$), ammonia hydroxide-hydrogen peroxide-water mixture, and/or hydrochloric acid-hydrogen peroxide-water mixture. Semiconductor material from the nanostructures 108 and the lower fin elements 103N and 103P is oxidized to form the interfacial layer 174, in accordance with some embodiments.

A gate dielectric layer 176 is formed conformally along the interfacial layer 174 to surround the nanostructures 108, as shown in FIGS. 1S and 1S-1, in accordance with some embodiments. The gate dielectric layer 176 is further conformally formed along the inner sidewalls of the gate spacer layers 146 facing the channel region and the inner sidewalls of the inner spacer layers 158 facing the channel region, as shown in FIG. 1S-1, in accordance with some embodiments. The gate dielectric layer 176 is further conformally formed on the top surfaces 126T3 of the dielectric walls 126A, as shown in FIGS. 1S and 1S-2, in accordance with some embodiments. The gate dielectric layer 176 is further conformally formed on the top surfaces 130T2 of the isolation structure 132B, as shown in FIGS. 1S and 1S-3, in accordance with some embodiments.

In addition, the gate dielectric layer 176 is further formed on the portions of the sidewalls of the dielectric walls 126A exposed from the gaps 172, as shown in FIG. 1S, in accordance with some embodiments. The gate dielectric layer 176 is in direct contact with the dielectric walls 126A and the wall spacers 122A, in accordance with some embodiments.

The gate dielectric layer 176 may be a high-k dielectric layer. In some embodiments, the high-k dielectric layer is made of a dielectric material with a high dielectric constant (k value); higher than 3.9, for example. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), a combination thereof, or another suitable material. The high-k dielectric layer may be deposited using ALD, PVD, CVD, and/or another suitable technique.

Work function metal material 178 (including 178N1, 178N2 and 178P) is formed to fill remainders of the gate trenches 170 and gaps 172, in accordance with some embodiments. The work function metal materials 178N and 178N2 are formed over the p-type well PW, and the work function metal material 178P is formed over the p-type wells PW and n-type well NW, in accordance with some embodiments. In some embodiments, the work function metal materials 178N1, 178N2 and 178P are used as metal gate electrode layers. In some embodiments, the work function metal materials 178N1, 178N2 and 178P have selected work functions to enhance the device performance (e.g., threshold voltage) for n-channel FETs or p-channel FETs.

In some embodiments, the work function metal materials 178N1, 178N2 and 178P are made of more than one conductive material, such as a metal, metal alloy, conductive metal oxide and/or metal nitride, another suitable conductive material, or a combination thereof. For example, the work function metal material 178 is TiN, TaN, TiAl, TiAlN, TaAl, TaAlN, TaAlC, TaCN, WNC, Co, Pt, W, Ti, Ag, Al, TaC, TaSiN, Mn, Zr, Ru, Mo, WN, Cu, W, Re, Ir, Ni, another suitable conductive material, or multilayers thereof. In some embodiments, the work function metal material 178N1 is made of TiN, TiSiN or TaN. In some embodiments, the work function metal material 178N2 is n-type metal such as TiAl, TiAlN, TaAl, TaAlN, TaAlC, TaSiAl, TaSiC or HfC. In some embodiments, the work function metal material 178P is p-type metal such as TiN, TiSiN, TaN, WCN, W, Mo or Co. The work function metal materials 178N1, 178N2 and 178P may be formed using ALD, PVD, CVD, e-beam evaporation, or another suitable technique.

In some embodiments, the work function metal materials 178N1 and 178N2 are sequentially deposited over the semiconductor structure 100 and overfill the gaps 172, and then the portions of the work function metal material 178N1 and 178N2 over the n-type well NW is removed using an etching process. Afterward, the work function metal material 178P is deposited over the semiconductor structure 100 and over fills the gaps 172 over the n-type well NW. In some embodiments, the spaces (i.e., the gaps 172) between the nanostructures 108 in the p-type wells PW are free of the work function metal material 178P.

A planarization process such as CMP may be performed on the semiconductor structure 100 to remove the materials of the gate dielectric layer 176 and the work function metal material 178 formed above the top surface of the dielectric capping layer 168, in accordance with some embodiments. In some embodiments, the top surface of the work function metal material 178P, the top surface of the dielectric capping layer 168 and the top surfaces of the gate spacer layers 146 are substantially coplanar.

The interfacial layer 174, the gate dielectric layer 176 and the work function metal materials 178 combine to form final gate stacks 180, in accordance with some embodiments. In some embodiments, the final gate stacks 180 extend in the Y direction. That is, the final gate stacks 180 have longitudinal axes parallel to the Y direction, in accordance with some embodiments. The final gate stacks 180 surround each of the nanostructures 108 and are interposed between the source/drain features 162, in accordance with some embodiments. The final gate stacks 180 combine with the source/drain features 162 to form nanostructure transistors, such as an n-channel nanostructure transistor in the p-type wells PW and a p-channel nanostructure transistor in the n-type well NW, in accordance with some embodiments. The final gate stacks 180 may engage the channel region of the nanostructures 108, so that current can flow between the source/drain features 162 during operation.

In some embodiments, the dielectric walls 126A and the wall spacers 122A may be used as lower portions of gate cut structures. In some cases, the gate cut structures are formed after the formation of the final gate stacks using a patterning process (including photolithography and etching processes). In accordance with the embodiments of the present disclosure, the semiconductor structure 100 having the fork-sheet structure may provide benefits. For example, the surface of each nanostructure 108 facing the end-cap abuts the wall spacer 122A and the dielectric wall 126A, thus avoiding variations in the amount of gate electrode material at the end-cap caused by the patterning process for forming gate cut structures. Therefore, the resulting nanostructure transistors may have a more uniform threshold voltage. In addition, the wall spacers 122A remain in the end-cap, and thus the gate electrode materials may not extend directly between the spaces between the nanostructures 108 and the dielectric walls 126A, which may reduce the parasitic capacitance between the final gate stacks and the source/drain features. Therefore, the performance of the resulting semiconductor device may be enhanced (e.g., speed). In addition, because the final gate stacks 180 may extend to the dielectric walls 126A by enlarging the trimming process of the dielectric liners 122, the final gate stacks 180 have a better control over the channels of the nanostructures 108 at the surfaces facing the end-cap, in accordance with some embodiments. Therefore, the performance of the resulting semiconductor device may be enhanced (e.g., lower off-state current).

Furthermore, as the scale of the semiconductor devices continues to shrink, forming the dielectric walls at specific locations is increasingly challenging because the trenches (between the fin structures) also have smaller and smaller dimensional differences. In accordance with the embodiments of the present disclosure, the desired dimensional difference between the trenches 116A and 116B may be created by forming the dielectric liners 122 in the trenches 116A using a patterning process. As a result, the trenches 116A may be entirely filled by the dielectric material 126 while the trenches 116B may be partially filled by the dielectric material 126, which may result in a large difference in the etching amount of the dielectric material 126 between the trenches 116A and 116B. Therefore, the dielectric walls 126 may be selectively formed in the trenches 116A.

It is understood that the semiconductor structure 100 may undergo further CMOS processes to form various features over the semiconductor structure 100, such as a multilayer interconnect structure (e.g., contacts to gate and/or source/drain features, vias, lines, inter metal dielectric layers, passivation layers, etc.).

FIG. 2 illustrates a semiconductor structure 200, which is a modification of the semiconductor structure 100 of FIG. 1S, in accordance with some embodiments of the disclosure.

A gate isolation layer 182 is formed through the final gate stack 180, as shown in FIG. 2, in accordance with some embodiments. The gate isolation layer 182 is aligned over and lands on one 126A1 of the dielectric walls 126A, in accordance with some embodiments. The gate isolation layer 182 and the dielectric wall 126A1 combine to form a gate cut structure, in accordance with some embodiments. The final gate stack 180 is divided by the gate cut structure into two segments 1801 and 1802, which are physically separated and electrically isolated from each other, in accordance with some embodiments.

In some embodiments, the formation of the gate isolation layer 182 includes patterning the final gate stacks 180 to form an opening (where the gate isolation layer 182 is to be formed) through the final gate stacks 180 and exposing the dielectric wall 126A1. The patterning process includes forming a patterned mask layer (such as a patterned hard mask layer or patterned photoresist layer) over the final gate stacks 180 followed by an anisotropic etching process. Due to the presence of the dielectric wall 126A1, the opening for the gate isolation layer 182 may have a small depth, thereby decreasing the process difficulty of the patterning process, e.g., overlay/CD (critical dimension) window.

In some embodiments, the formation of the gate isolation layer 182 also includes depositing a dielectric material for the gate isolation layer 182 over the semiconductor structure 100 to overfill the opening in the final gate stacks 180. In some embodiments, the gate isolation layer 182 is made of a dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide ($SiO_2$), or a combination thereof. The deposition process may be ALD, CVD (such as LPCVD, PECVD, HDP-CVD, or HARP), another suitable technique, or a combination thereof.

In some embodiments, a planarization process such as CMP may be performed on the semiconductor structure 100 to remove the dielectric material formed above the upper surface of the final gate stacks 180, in accordance with some embodiments. A remaining portion of the dielectric material in the opening serves as the gate isolation layer 182, in accordance with some embodiments. In some embodiments, after the planarization process, the top surface of the gate isolation layer 182 and the top surface of the work function metal material 178P are substantially coplanar.

As described above, the aspect of the present disclosure is directed to a semiconductor structure having the fork-sheet structure. The method for forming the semiconductor structure includes forming a dielectric liner 122 in the trench 116A using a patterning process such that the dimension of the remaining portion of the trench 116A is less than the dimension of the trench 116B. The method further includes forming a dielectric material 126 in the trenches 116A and 116B, and etching back the dielectric material 126. Because the trench 116A is overfilled by the dielectric material 126 while the trench 116B is partially filled by the dielectric wall 126A, and thus the dielectric wall 126A may be selectively formed in the trench 116A. Therefore, the difficulty of forming a dielectric wall at a specific location may be reduced, and the yield of manufacturing the semiconductor device may be improved.

Embodiments of a semiconductor structure and the method for forming the same may be provided. The method may include forming a first dielectric material along a first trench between a first fin structure and a second fin structure and along a second trench between the second fin structure and a third fin structure, removing a first portion of the first dielectric material along the second trench, depositing a second dielectric material, and etching back the second dielectric material. The portion of the second dielectric material remaining in the first trench forms a dielectric wall. Therefore, the difficulty of forming a dielectric wall may be reduced, and the yield of manufacturing the semiconductor device may be improved.

In some embodiments, a method for forming a semiconductor structure is provided. The method includes forming a first fin structure, a second fin structure and a third fin structure over a substrate, forming a first dielectric material along a first trench between the first fin structure and the second fin structure and along a second trench between the second fin structure and the third fin structure, removing a first portion of the first dielectric material along the second trench while leaving a second portion of the first dielectric material along the first trench as a dielectric liner, depositing a second dielectric material over the dielectric liner and filling the first trench and the second trench, and etching back the second dielectric material until the dielectric liner is exposed. A first portion of the second dielectric material remaining in the first trench forms a dielectric wall.

In some embodiments, a method for forming a semiconductor structure is provided. The method includes forming a first fin structure, a second fin structure and a third fin structure over a substrate, forming a dielectric liner partially covering the first fin structure and the second fin structure, forming a dielectric material over the dielectric liner, the first fin structure, the second fin structure and the third fin structure, and etching the dielectric material. A first portion of the dielectric material between the first fin structure and the second fin structure forms a dielectric wall. A second portion of the dielectric material between the second fin structure and the third fin structure forms a lower isolation layer. The dielectric wall is thicker than the lower isolation layer. The method further includes forming an upper isolation layer over the lower isolation layer, forming a dummy gate structure across the first fin structure, the dielectric wall, the second fin structure, the upper isolation layer and the third fin structure.

In some embodiments, a semiconductor structure is provided. The semiconductor structure includes a dielectric wall over a substrate, an isolation structure laterally spaced apart from the dielectric wall, and a fin element between the isolation structure and the dielectric wall. The isolation structure includes a lower isolation layer and an upper isolation layer over the lower isolation layer. Both the lower isolation layer and the upper isolation layer are in direct contact with the fin element. The semiconductor structure further includes a set of nanostructures vertically stacked over the fin element and spaced apart from one another, and a gate stack over the isolation structure and the dielectric wall and surrounding the set of nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a first fin structure, a second fin structure and a third fin structure over a substrate, wherein each of the first fin structure, the second fin structure and the third fin structure includes alternatingly stacking first semiconductor layers and second semiconductor layers;
    forming a first dielectric material along a first trench between the first fin structure and the second fin structure and along a second trench between the second fin structure and the third fin structure;
    removing a first portion of the first dielectric material along the second trench while leaving a second portion of the first dielectric material along the first trench as a dielectric liner;
    depositing a second dielectric material over the dielectric liner and filling the first trench and the second trench; and
    etching back the second dielectric material until the dielectric liner is exposed, wherein a first portion of the second dielectric material remaining in the first trench forms a dielectric wall; and
    removing the first semiconductor layers of the first fin structure, the first semiconductor layers of the second fin structure and the first semiconductor layers of the third fin structure, thereby forming first gaps, second gaps and third gaps, respectively, wherein the dielectric liner is exposed from the first gaps, wherein the second semiconductor layers of the first fin structure, the second semiconductor layers of the second fin structure and the second semiconductor layers of the third fin structure form a first set of nanostructures, a second set of nanostructures and a third set of nanostructures, respectively.

2. The method for forming the semiconductor structure as claimed in claim 1, wherein a second portion of the second dielectric material remaining in the second trench forms an isolation layer, and the isolation layer is thinner than the dielectric wall.

3. The method for forming the semiconductor structure as claimed in claim 1, wherein removing the first portion of the first dielectric material along the second trench is performed until a sidewall of the second fin structure and a sidewall of the third fin structure are exposed.

4. The method for forming the semiconductor structure as claimed in claim 1, wherein the second dielectric material is deposited until a third portion of the second dielectric material formed along the first fin structure in the first trench is merged with a fourth portion of the second dielectric material formed along the second fin structure in the first trench.

5. The method for forming the semiconductor structure as claimed in claim 4, wherein when formation of the second dielectric material is complete, a void is formed between a fifth portion of the second dielectric material formed along the second fin structure in the second trench and a sixth portion of the second dielectric material formed along the third fin structure in the second trench.

6. The method for forming the semiconductor structure as claimed in claim 1, further comprising:
removing a portion of the dielectric liner exposed from the first gaps until the dielectric wall is exposed;
forming a gate dielectric layer surrounding the first set of nanostructures, the second set of nanostructures and the third set of nanostructures; and
forming a metal gate electrode material over the gate dielectric layer.

7. The method for forming the semiconductor structure as claimed in claim 1, further comprising:
etching the first fin structure, the second fin structure, the third fin structure and the dielectric wall to form a first recess, a second recess, a third recess and a fourth recess, respectively, wherein the first recess is deeper than the fourth recess; and
forming a first source/drain feature, a second source/drain feature and a third source/drain feature in the first recess, the second recess and the third recess, respectively.

8. A method for forming a semiconductor structure, comprising:
forming a first fin structure, a second fin structure and a third fin structure over a substrate;
forming a dielectric liner partially covering the first fin structure and the second fin structure;
forming a dielectric material over the dielectric liner, the first fin structure, the second fin structure and the third fin structure;
etching the dielectric material, wherein a first portion of the dielectric material between the first fin structure and the second fin structure forms a dielectric wall, a second portion of the dielectric material between the second fin structure and the third fin structure forms a lower isolation layer, and the dielectric wall is thicker than the lower isolation layer;
forming an upper isolation layer over the lower isolation layer; and
forming a dummy gate structure across the first fin structure, the dielectric wall, the second fin structure, the upper isolation layer and the third fin structure.

9. The method for forming the semiconductor structure as claimed in claim 8, wherein the dielectric liner has a terminal directly above a top surface of the second fin structure.

10. The method for forming the semiconductor structure as claimed in claim 8, wherein a top surface of the dielectric wall is higher than a top surface of the upper isolation layer.

11. The method for forming the semiconductor structure as claimed in claim 8, wherein each of the first fin structure, the second fin structure and the third fin structure includes a lower fin element and first semiconductor layers and second semiconductor layers alternatingly stacked over the lower fin element, and both the upper isolation layer and the lower isolation layer are in direct contact with the lower fin element of the second fin structure.

12. The method for forming the semiconductor structure as claimed in claim 11, further comprising:
removing the dummy gate structure;
removing the first semiconductor layers of the first fin structure, the second fin structure and the third fin structure, thereby forming a plurality of gaps, wherein the plurality of gaps exposes the dielectric liner;
etching the dielectric liners, thereby enlarging the plurality of gaps; and
forming a gate stack to fill the plurality of gaps.

13. The method for forming the semiconductor structure as claimed in claim 8, further comprising:
forming an n-type well and a p-type well in the substrate, wherein the first fin structure and the second fin structure are formed over the n-type well, and the third fin structure is formed over the p-type well.

14. The method for forming the semiconductor structure as claimed in claim 8, wherein the dielectric liner includes a first portion extending along a sidewall of the first fin structure and a second portion extending along a sidewall of the second fin structure, a first distance between the first portion and the second portion of the dielectric liner is less than a second distance between the second fin structure and the third fin structure.

15. A semiconductor structure, comprising:
a dielectric wall over a substrate;
an isolation structure laterally spaced apart from the dielectric wall;
a fin element between the isolation structure and the dielectric wall, wherein the isolation structure includes a lower isolation layer and an upper isolation layer over the lower isolation layer, wherein both the lower isolation layer and the upper isolation layer are in direct contact with the fin element, wherein the dielectric wall is taller than the fin element, the fin element is taller than the isolation structure, and a dielectric constant of the lower isolation layer is higher than a dielectric constant of the upper isolation layer;
a set of nanostructures vertically stacked over the fin element and spaced apart from one another; and
a gate stack over the isolation structure and the dielectric wall and surrounding the set of nanostructures.

16. The semiconductor structure as claimed in claim 15, further comprising:

a set of wall spacers interposed between the dielectric wall and first sidewalls of the set of nanostructures, wherein the gate stack comprises a gate dielectric layer extending along second, third and fourth sidewalls of the set of nanostructures, wherein the gate dielectric layer is in direct contact with the set of wall spacers and the dielectric wall.

17. The semiconductor structure as claimed in claim 16, which further comprises:
a gate isolation layer in the gate stack and on the dielectric wall, wherein the gate stack includes a first segment and a second segment separated from the first segment by the gate isolation layer and the dielectric wall.

18. The method for forming the semiconductor structure as claimed in claim 17, wherein in a cross-sectional view, the dielectric wall is wider than the gate isolation layer.

19. The method for forming the semiconductor structure as claimed in claim 15, wherein the lower isolation layer and the upper isolation layer are in direct contact with the fin element.

20. The method for forming the semiconductor structure as claimed in claim 15, wherein the set of nanostructures includes a first nanostructure, a gate electrode layer of the gate stack extends along first, second and third surface of the first nanostructure, and the dielectric wall extends along a fourth surface of the first nanostructure.

\* \* \* \* \*